US006308190B1

(12) United States Patent
Willson, Jr. et al.

(10) Patent No.: US 6,308,190 B1
(45) Date of Patent: Oct. 23, 2001

(54) LOW-POWER PULSE-SHAPING DIGITAL FILTERS

(75) Inventors: Alan N. Willson, Jr., Pasadena; Larry S. Wasserman, Granada Hills, both of CA (US)

(73) Assignee: Pentomics, Inc., Pasadena, CA (US)

(*) Notice: Subject to any disclaimer, the term of this patent is extended or adjusted under 35 U.S.C. 154(b) by 0 days.

(21) Appl. No.: 09/211,357

(22) Filed: Dec. 15, 1998

Related U.S. Application Data

(60) Provisional application No. 60/069,636, filed on Dec. 15, 1997.

(51) Int. Cl.[7] .................................................. G06F 17/10
(52) U.S. Cl. ............................................ 708/319; 708/306
(58) Field of Search .................................. 708/306, 313, 708/319, 322

(56) References Cited

U.S. PATENT DOCUMENTS 4,746,899  5/1988  Swanson et al. .
5,953,241 * 9/1999  Hansen et al. ........................ 708/319

OTHER PUBLICATIONS

Chevillat, Pierre R. et al., "Optimum FIR Transmitter and Receiver Filters for Data Transmission over Band–Limited Channels," IEEE Transactions on Communications, vol. Com–30, No. 8, Aug. 1982, pp. 1909–1915.

Kuo, Tzu–Chieh et al., "A Programmable Interpolation Filter for Digital Communications Applications," Proceedings of the 1998 IEEE International Symposium on Circuits and Systems, May 31–Jun. 3, 1998, Monterey, CA, IEEE, 1998, vol. II, pp. II–98—II–100.

(List continued on next page.)

*Primary Examiner*—Tan V. Mai
(74) *Attorney, Agent, or Firm*—Gates & Cooper LLP

(57) ABSTRACT

A method, apparatus, article of manufacture, and a memory structure for low power digital filtering. The method comprises the steps of successively delaying each of the input values $\{x_0, x_1, \ldots, x_{N-1}\}$ to create tap values $\{t_0, t_1, \ldots, t_{N-1}\}$, multiplying each of the tap values $\{t_0, t_1, \ldots, t_{N-1}\}$ by $A \cdot \{h_0, h_1, \ldots, h_{N-1}\}$ to produce $\{At_0h_0, At_1h_1, \ldots, At_{N-1}h_{N-1}\}$ wherein values $\{h_0, h_1, \ldots, h_{N-1}\}$ are weight values selected to achieve a desired filter response and A is a factor selected to improve computational efficiency in filtering the input data stream, summing the values $\{At_0h_0, At_1h_1, \ldots, At_{N-1}h_{N-1}\}$ to produce $$\sum_{k=0}^{N-1} At_k h_k,$$

biasing the summed values $\{At_0h_0, At_1h_1, \ldots, At_{N-1}h_{N-1}\}$ to compensate for the modified filter tap values and to produce a digital filter output. The article of manufacture comprises means for performing the above method steps. The apparatus comprises an interconnected series of k stages wherein $k = \{1, 2, \ldots, N-1\}$. Each of the stages comprises a delay element $Z_k^{-1}$ having a delay element input and a delay element output, a weighting element having a weighting element input and a weighting element output, wherein a gain of the weighting element is selected to be a product of a gain $h_k$ required to achieve a desired digital filter response, and a factor A selected to improve computational efficiency, and a summation element having a first summation element input, a second summation element input, and a summation element output. A bias summation element is coupled between the leading gain element and the first stage summation element, for adding a bias to compensate for the factored weighting element gains.

41 Claims, 27 Drawing Sheets

OTHER PUBLICATIONS

Kuo, Tzu–Chieh, "A Programmable Interpolation Filter for Digital Communication Applications," Thesis, Master of Science in Electrical Engineering, University of California, Los Angeles, CA, 1996, pp. xi, 1–51.

Moreau de Saint–Martin, Francois et al., "Design of Optimal Linear–Phase Transmitter and Receiver Filters for Digital Systems," IEEE, 1995, pp. 885–888.

Proakis, John G. et al., "Digital Signal Processing: Principles, Algorithms, and Applications," Macmillan Publishing Company, New York, pp. 485–502, undated.

Samueli, Henry, "On the Design of Optimal Equiripple FIR Digital Filters for Data Transmission Applications," IEEE Transactions on Circuits and Systems, vol. 35, No. 12, Dec. 1988, pp. 1542–1546.

Samueli, Henry, "On the Design of FIR Digital Data Transmission Filters with Arbitrary Magnitude Specifications," IEEE Transactions on Circuits and Systems, vol. 38, No. 12, Dec. 1991, pp. 1563–1567.

Thompson, Charles D. et al., "A Digitally–Corrected 20b Delta–Sigma Modulator," IEEE International Solid–State Circuits Conference, Session 11/Oversampled Data Conversion/Paper TP 11.5, IEEE 1994, pp. 194–195.

Vaidyanathan, P.P., "Multirate Systems and Filter Banks," Prentice Hall, Englewood Cliffs, new Jersey 07632, pp. 118–134, undated.

* cited by examiner

LOW-POWER PULSE-SHAPING DIGITAL FILTERS

CROSS REFERENCE TO RELATED APPLICATIONS

This application claims benefit of U.S. Provisional Application No. 60/069,636, filed Dec. 15, 1997, by Alan N. Willson, Jr. and Larry S. Wasserman and entitled "LOW-POWER PULSE-SHAPING DIGITAL FILTERS," which application is hereby incorporated by reference herein.

GOVERNMENT LICENSE RIGHTS STATEMENT

The U.S. Government has a paid-up license in this invention and the right in limited circumstances to require the patent owner to license others on reasonable terms as provided for by the terms of grant No. N00014-95-1-0231 awarded by the Office of Naval Research and grant No. MIP-9632698, awarded by the National Science Foundation.

BACKGROUND OF THE INVENTION

1. Field of the Invention

The present invention relates to systems and methods of digital filtering, and in particular to low-power pulse-shaping digital filters.

2. Description of the Related Art

A pulse-shaping digital filter is a digital system consisting of a data rate expander (that inserts zeros between successive input bits) followed by a digital filter operating at the higher data rate. The system accepts an input stream of symbols which, in the most elementary form, is a stream of one-bit data, and produces an output stream of B-bit data (where B is a fixed positive integer) having a waveform suitable for processing by a digital-to-analog converter (DAC). The DAC yields an analog signal whose waveform contains the original bit-stream's information while having its frequency content appropriately bandlimited for transmission through some given communication channel.

Pulse-shaping filters, both analog and digital, have been well studied in the literature for several decades and their importance in the implementation of practical communication systems has only increased as the interest in transmitting digital data has increased. The recent popular interest in wireless digital communication systems such as digital cellular telephones has highlighted the need for digital filter implementations that minimize power dissipation. The present invention satisfies that need.

SUMMARY OF THE INVENTION

To address the requirements described above, the present invention discloses a method, apparatus, article of manufacture, and a memory structure for implementing a low-power digital filter.

The method comprises the steps of successively delaying and mapping each of the input values $\{x_0, x_1, \ldots, x_{N-1}\}$ to create tap values $\{t_0, t_1, \ldots, t_{N-1}\}$, multiplying each of the tap values $\{t_0, t_1, \ldots, t_{N-1}\}$ by $A \cdot \{h_0, h_1, \ldots, h_{N-1}\}$ to produce $\{At_0 h_0, At_1 h_1, \ldots, At_{N-1} h_{N-1}\}$ wherein values $\{h_0, \ldots, h_{N-1}\}$ are weight values selected to achieve a desired filter response and A is a factor selected to improve computational efficiency and the efficiency of hardware implementation by, for example, reducing the number of operations performed in filtering the input data stream, summing the values $\{At_0 h_0, At_1 h_1, \ldots, At_{N-1} h_{N-1}\}$ to produce $$\sum_{k=0}^{N-1} At_k h_k,$$

biasing the summed values $\{At_0 h_0, At_1 h_1, \ldots, At_{N-1} h_{N-1}\}$ to compensate for the multiplied tap values $\{At_0 h_0, At_1 h_1, \ldots, At_{N-1} h_{N-1}\}$ to produce a digital filter output.

The article of manufacture comprises means for performing the above method steps. The apparatus comprises an interconnected series of k stages wherein $k = \{1, 2, \ldots, N-1\}$. Each of the stages comprises a delay element $z_k^{-1}$ having a delay element input and a delay element output, a weighting element having a weighting element input and a weighting element output, wherein a gain of the weighting element is selected to be a product of a gain $h_k$ required to achieve a desired digital filter response, and a factor A selected to improve computational and hardware efficiency, and a summation element having a first summation element input, a second summation element input, and a summation element output. The apparatus further comprises a leading gain element with a gain $h_0$ required to achieve a desired digital filter frequency response, and a factor A selected to improve computational and hardware efficiency. The leading gain element has a leading gain element input coupled to a first stage delay element input and a leading gain element output coupled to a first stage first summation element input. The delay element output of each stage is coupled to the gain element input of the stage and the gain element output of each stage is coupled to the second summation element input of the stage. The delay element output of each stage except the last (N-1 stage) is coupled to the delay element input of the following stage and the summation element output of each stage except the last is coupled to the first summation element input of the following stage. The summation element output of the last stage provides the digital filter output. The digital filter's input is connected to the delay element input of the first stage. A bias summation element modifies the above-described structure by coupling another summation element between the leading gain element output and the first stage summation element input. A bias to compensate for the modified weighting element outputs is provided at the bias summation element.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description, reference is made to the accompanying drawings which form a part hereof, and in which is shown, by way of illustration, several embodiments of the present invention. It is understood that other embodiments may be utilized and structural changes may be made without departing from the scope of the present invention.

Hardware Environment

Figure 1:
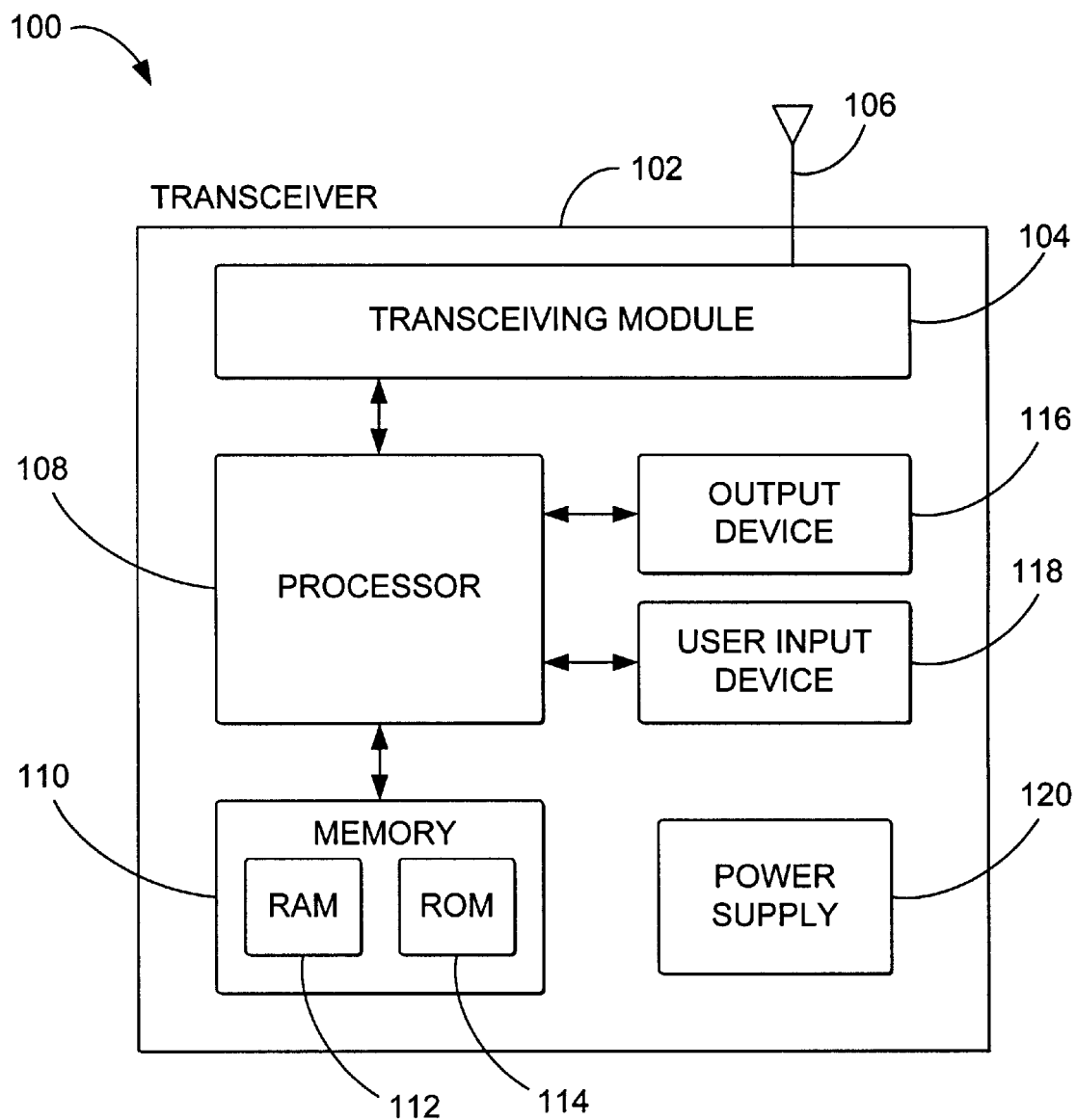
FIG. 1 is a block diagram showing an exemplary hardware environment for practicing the present invention.

FIG. 1 is a block diagram illustrating an exemplary hardware environment for the present invention, comprising a digital transceiver system 100. The digital transceiver system 100 comprises a transceiver 102 having one or more antennae 106 for receiving and transmitting information. An analog or hybrid transceiving module is coupled to the antenna 106 and a processor 108. The transceiving module 104, in cooperation with the processor 108, performs the functions necessary to receive and transmit digital data. Processor 108 implements the digital filters described herein, and is coupled to a memory 110, which may include a random access memory 112 for storing program instructions or data and a read only memory 114 for storing program instructions or other data. The processor is also coupled to an output device 116, such as a speaker system or display, which allows the user to communicate with the transceiver 102. The processor also accepts input from user input device 118, which may be a keypad or other device allowing the user to provide input to the transceiver 102. Power consuming elements in the transceiver are coupled to the power supply 120, which may comprise a battery or other source of electrical power and other associated circuitry to control and disseminate power within the transceiver 102.

While the present invention can be advantageously applied to digital wireless communication systems, it may also be applied to any data processing task utilizing digital filters, including a general purpose computer system.

Figure 2:
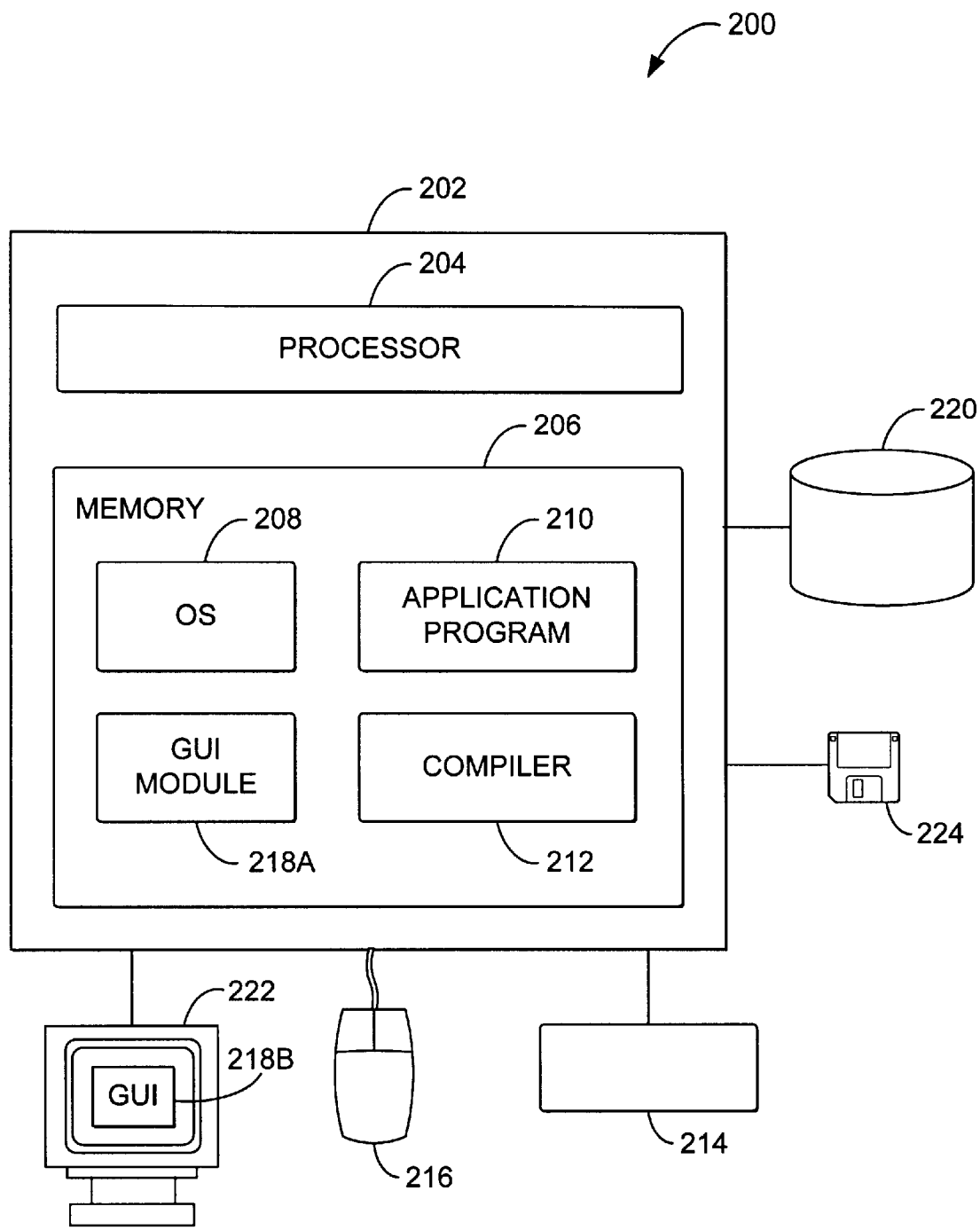
FIG. 2 is a block diagram of an alternative hardware environment for the present invention.

FIG. 2 illustrates an exemplary computer system 200 that could be used to implement low-power pulse-shaping digital filters. The computer system 200 comprises a computer 202 having a processor 204 and a memory, such as random access memory (RAM) 206. The computer 202 is operatively coupled to a display 222, which presents information such as images to the user on an interface such as a graphical user interface 218B. The computer 202 may be coupled to other devices, such as a keyboard 214, a mouse device 216, a printer, etc. Of course, those skilled in the art will recognize that any combination of the above components, or any number of different components, peripherals, and other devices, may be used with the computer 202.

Generally, the computer 202 operates under control of an operating system 208 stored in the memory 206, and interfaces with the user to accept inputs and commands and to present results through an interface such as a graphical user interface (GUI) module 218A. Although the GUI module 218A is depicted as a separate module, the instructions performing the GUI functions can be resident or distributed in the operating system 208, the application program 210, or implemented with special purpose memory and processors. The computer 202 also implements a compiler 212 which allows an application program 210 written in a programming language such as COBOL, C++, FORTRAN, or other language to be translated into processor 204 readable code. After completion, the application 210 accesses and manipulates data stored in the memory 206 of the computer 202 using the relationships and logic that was generated using the compiler 212.

In one embodiment, instructions implementing the operating system 208, the computer program 210, and the compiler 212 are tangibly embodied in a computer-readable medium, e.g., data storage device 220, which could include one or more fixed or removable data storage devices, such as a zip drive, floppy disc drive 224, hard drive, CD-ROM drive, tape drive, smart card, etc. Further, the operating system 208 and the computer program 210 are comprised of instructions which, when read and executed by the computer 202, causes the computer 202 to perform the steps necessary to implement and/or use the present invention. Computer program 210 and/or operating instructions may also be tangibly embodied in memory 206 and/or data communications devices, thereby making a computer program product or article of manufacture according to the invention. As such, the terms "article of manufacture" and "computer program product" as used herein are intended to encompass a computer program accessible from any computer readable device or media.

Those skilled in the art will recognize many modifications may be made to this configuration without departing from the scope of the present invention. For example, those skilled in the art will recognize that any combination of the above components, or any number of different components, peripherals, and other devices, may be used with the present invention.

BACKGROUND

Figure 3:
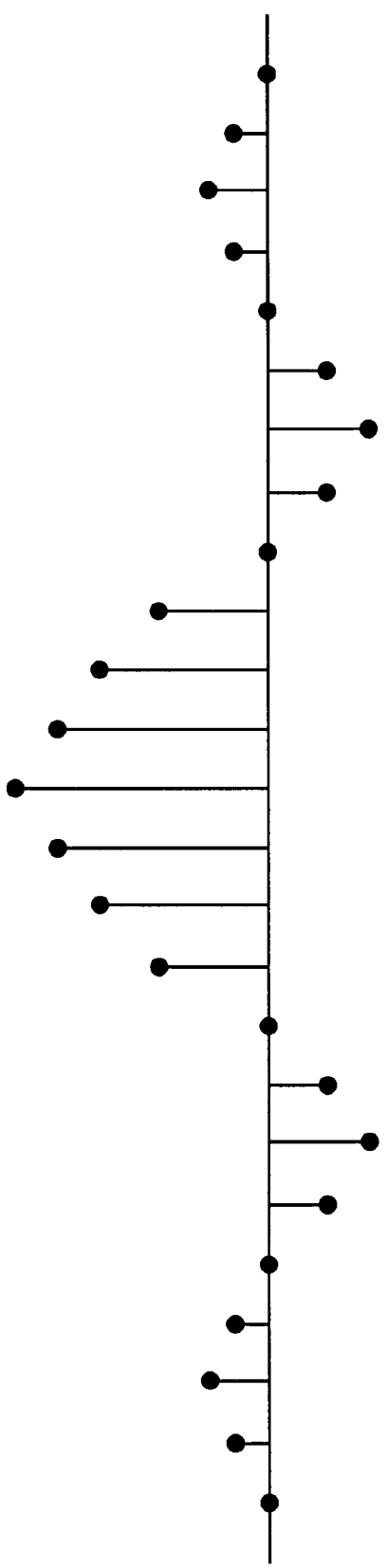
FIG. 3 is an illustration of the impulse response of a typical Nyquist digital filter.

FIG. 3 shows the impulse response of a typical "Nyquist filter." The combined digital transmit and receive filters in a typical communication system are often designed to approximate such filters, as described in P. R. Chevillat and G. Ungerboeck, "Optimum FIR Transmitter and Receiver Filters for Data Transmission over Band-limited Channels," *IEEE Transactions on Communications*, vol. COM-30, pp. 1909–1915, August 1982; H. Samueli, "On the Design of Optimal Equiripple FIR Digital Filters for Data Transmission Applications," *IEEE Transactions on Circuits and Systems*, vol. 35, pp. 1542–1546, December 1988; H. Samueli, "On the Design of Digital Data Transmission Filters with Arbitrary Magnitude Specifications," *IEEE Transactions on Circuits and Systems*, vol. 38, pp. 1563–1567, December 1991; and F. Moreau de Saint-Martin and P. Siohan, "Design of Optimal Linear-Phase Transmitter and Receiver Filters for Digital Systems," *Proceedings of the 1995 International Symposium on Circuits and Systems*, Seattle, Apr. 30–May 3, 1995, pp. 885–888, which references are hereby incorporated by reference herein.

The signal depicted in FIG. 3 would be the sort of signal a receiver's analog-to-digital converter and digital filters would produce when the transmitted bit-stream consisted of just a single bit, i.e., a "1." If the transmitted bit was a "0" then a sequence having the opposite polarity to that of FIG. 3 would be produced within the receiver. A general input bit-stream would, of course, produce superimposed copies of the FIG. 3 sequence or its negative, with each copy corresponding to an input bit and, thus, each copy offset (delayed) from the preceding copy by the number of output samples produced per input bit (a four-sample delay for the FIG. 3 example). Since the FIG. 3 impulse response sequence is arranged to have equally spaced zero values on each side of the center point (every four samples, in this instance), it's evident that, in this superpositioning process, no other response-sequence copies will interfere with the center value of any input bit's response sequence. This absence of inter-symbol interference, of course, provides the means by which, once appropriate synchronization is achieved, the original bit-stream can be recovered.

A transmitter's pulse-shaping filter must have an impulse response that, when cascaded with other filters in the transmitter and receiver, yields a close approximation to the FIG. 3 type impulse response. Its design is also influenced by the requirement that its response sequence, when processed by the transmitter's other digital filters and its digital-to-analog converter (DAC), must produce a suitably bandlimited waveform. Techniques for finite impulse response (FIR) pulse-shaping filter design have been reported in the above references.

Figure 4:
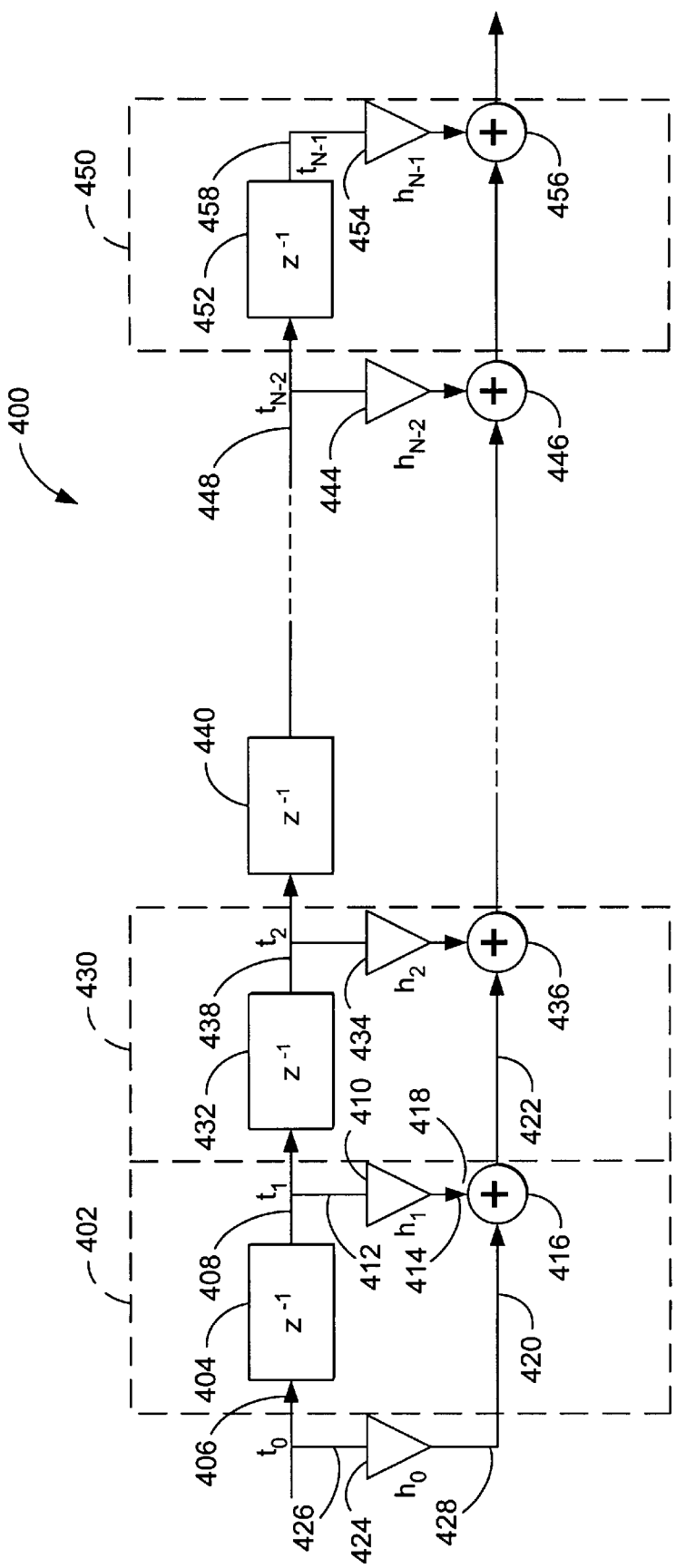
FIG. 4 is a finite impulse response digital filter.

FIG. 4 is a block diagram of a finite impulse response N-tap digital filter 400. The digital filter comprises a plurality of interconnected stages 402, 430 and 450. The first stage 402 has a delay element 404, a weighting element 410, and a summation element 416. The delay element 404 has a delay element input 406, and a delay element output 408 corresponding to a tap value $t_1$, that is coupled to a weighting element input 412. The output of the weighting element 414 is coupled to a first summation element input 418. The first stage 402 is interconnected with the second stage 430 by connection of the delay element output 408 to the delay element input of the following stage 430, and by interconnection of the summation element output 422 of the first stage with the second summation element input of the following stage. The digital filter 400 also comprises a leading gain element 424 whose input is coupled to the delay element input 406 of the delay element 404 of the first stage 402, and whose output is coupled to the second summation element input 420 of the first stage 402. As shown in FIG. 4, the finite impulse response digital filter 400 comprises one or more of the stages described above, and implements a sum of a series of delayed and weighted input values. The tap-weight values of the weighting elements $\{h_0, h_1, \ldots, h_{N-1}\}$ 424, 410, 434, 444, and 454 are selected to achieve a desired digital filter response. As described below, the values of the weighting elements $\{h_0, h_1, \ldots, h_{N-1}\}$ 424, 410, 434, 444, and 454 can be selected to compensate for a mapping of the input bits (i.e., the use of bits selected from the set $\{1,0\}$ for convenient hardware implementation, where the desired response is the response that would result if the inputs were actually selected from the set $\{1, -1\}$).

Since this filter operates upon an expanded bit-stream, with the filter considering a $-1$ value to correspond to each true input-data bit of zero (as distinct from the zero bits added by the expander, which must be treated as zero) the filter simply needs to compute a sum of terms consisting of each tap weight multiplied by a member of the set $\{0, 1, -1\}$. That is, just $N-1$ additions are required per input bit, for an N-tap filter.

While the processing of the expanded input bit-stream could be accomplished exactly as described in the preceding paragraph, there are well-known ways to improve the system's organization and efficiency by combining the expansion and filtering operations into a set of smaller FIR filters that operate in parallel at the lower (unexpanded) data rate of the input bit-stream and with only the "1" and "−1" bits occurring. Such "polyphase implementations" are discussed, for example, in P. P. Vaidyanathan, *Multirate Systems and Filter Banks*. Englewood Cliffs, N.J.: Prentice-Hall, 1993, which is hereby incorporated by reference herein.

We thus turn our attention to a typical polyphase component filter, which we can still envision as being represented by the FIG. 4 structure; but now we have an input data stream containing no expander zeros, i.e., consisting of a sequence of mapped points taken from the set $\{1, -1\}$. Since, however, it's highly advantageous to employ one-bit data, and since the actual data stream is comprised of zero and one bits, that is what is provided to each polyphase component filter. It will be the filter's responsibility to treat each zero in its input data stream as though it had the value $-1$. Thus, the filter produces an output sample by accumulating an algebraic sum of the tap weights, where an $h_k$ value is either added or subtracted depending on whether its data bit corresponds to an input bit of one or zero, respectively. Letting N now denote the length of this polyphase component filter, we require $N-1$ add/subtract operations to produce each output sample. One way to implement the filter, given sufficiently low data rates, would be to sequentially process the tap weights $h_0, \ldots, h_{N-1}$ accumulating their algebraic sum using a single add/subtract unit. However it is organized, some such accumulation process must be performed each time a new input bit is accepted by the FIG. 4 filter.

Low-Power Pulse Shaping Digital Filter

We now describe a method and apparatus for reducing the number of add/subtract operations for the filter shown in FIG. 4 by about one-half. If there were an equal mix of one and zero bits in the incoming bit-stream and if we could process them directly as one and zero, rather than treating the zero as if it were −1, we could achieve our goal of reducing the number of add/subtract operations by just skipping the subtraction operation for all tap weights having a corresponding zero bit. However, this would give the wrong result for the computed output sample value; moreover, it's not evident that enough zero input bits would necessarily be present at some particular point in time that any savings would be achieved. Fortunately, these concerns can be remedied as described below. Notice that, in addition to the potential for power savings by requiring fewer add/subtract operations, the processing of one-bit data in the normal manner also provides the design advantages of a simplified system.

Figure 5A:
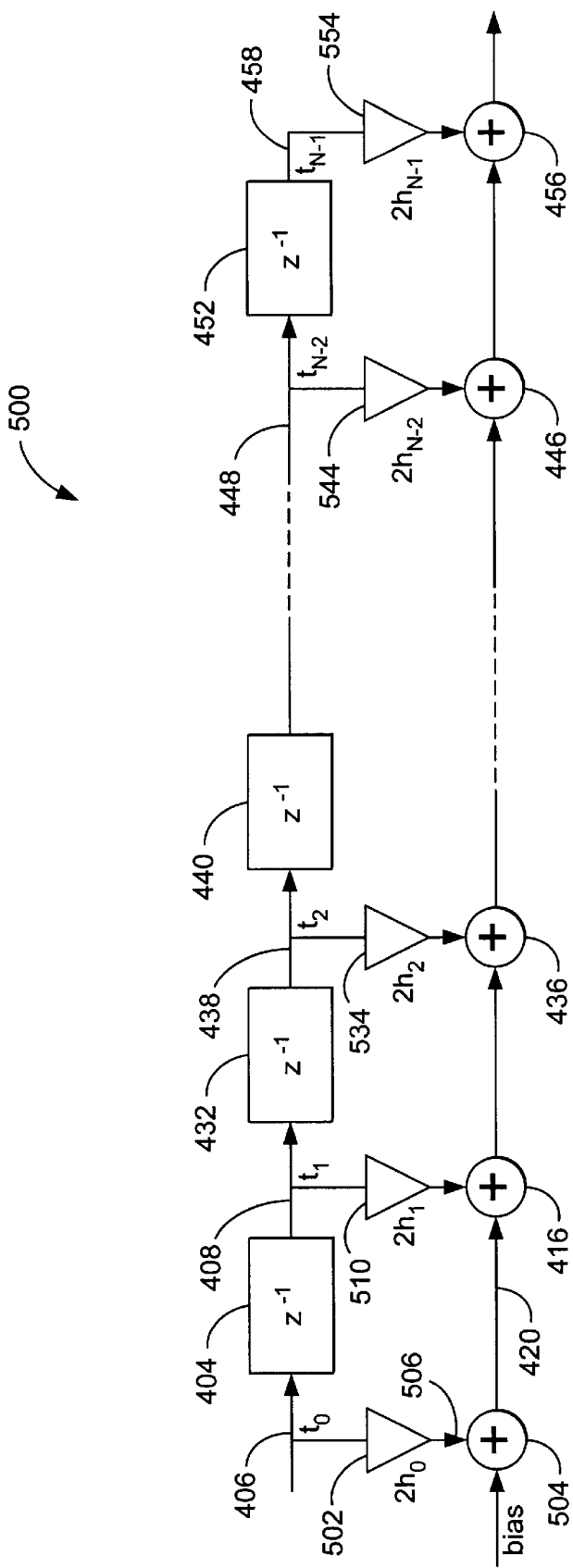
FIGS. 5A–C are block diagrams showing selected embodiments of a low-power pulse-shaping digital filter.

FIG. 5A is a block diagram of a low-power pulse-shaping digital filter 500. The low-power pulse-shaping digital filter 500 comprises the same delay elements 404, 432, 440, and 452 as the general finite impulse response digital filter 400, with two important differences. First, the low-power pulse-shaping digital filter 500 includes a bias element 504, and each of the tap weights has been multiplied by a factor A, which is selected to improve the computational efficiency of the digital filter. A can be selected to improve computational efficiency by reducing the number of digital filter operations, by permitting the use of different hardware implementations which reduce the number of operations, take advantage of advantageous circuit topologies, or to allow the use of special purpose hardware elements. In the illustrative embodiment of FIG. 5A, A=2, hence the tap weights 424, 410, 434, 444, and 454 have been modified from $h_k$ to $2h_k$. In this case, the factor A was selected to reduce the number of add and/or subtract operations.

Figure 5B:
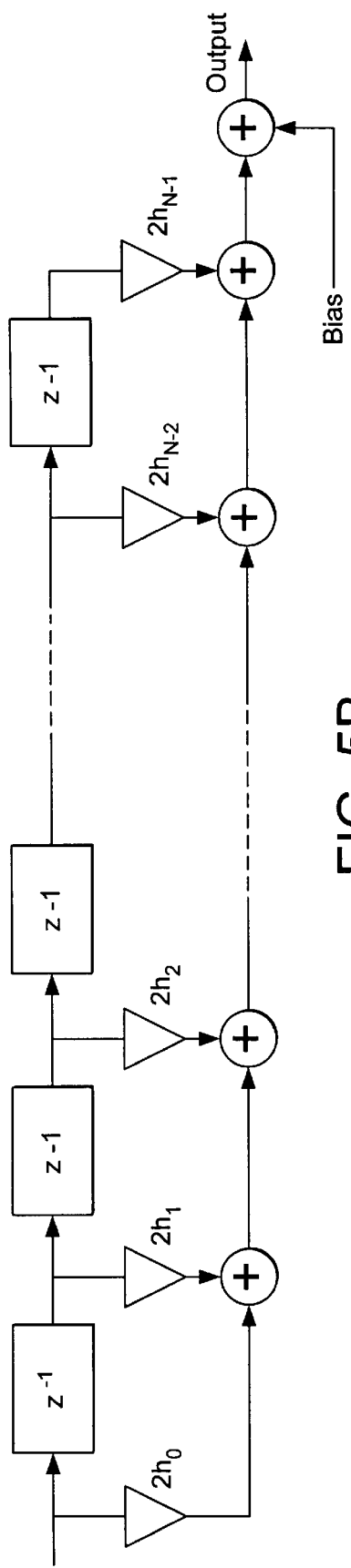
Figure 5C:
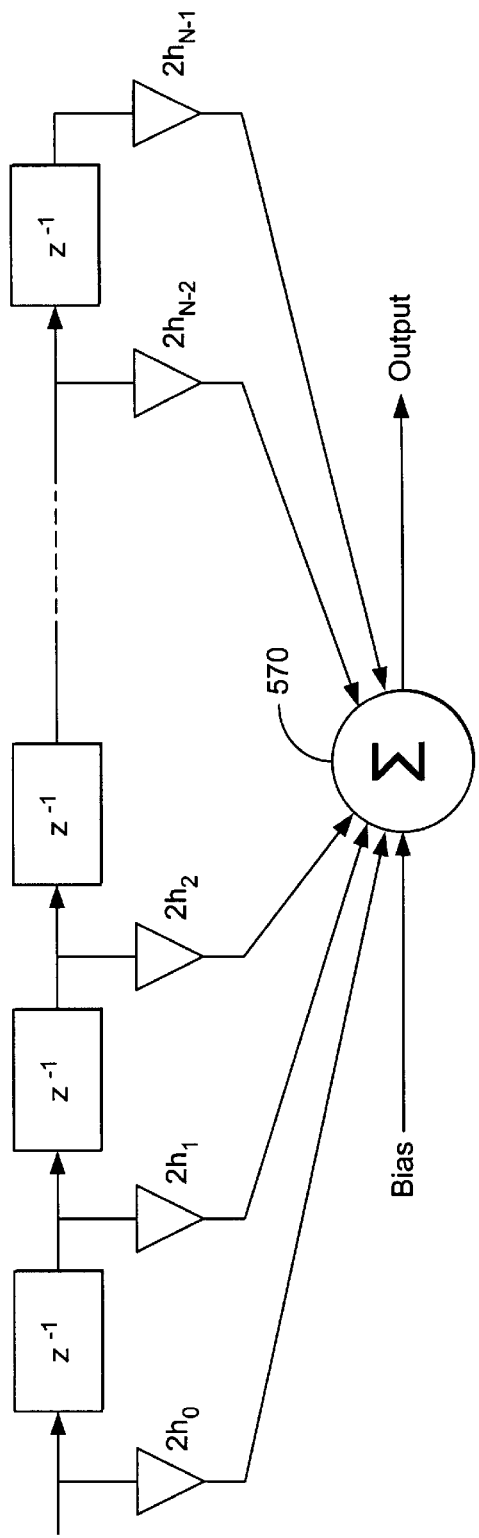

The FIG. 5A digital filter includes a bias or offset value of $-\Sigma h_k = -(h_0 + \ldots + h_{N-1})$ in the accumulator or summing element 504 where the output sample value is to be computed. This bias compensates for the input mapping and modified gain provided by the factor A. In the example of FIG. 5A, if each one and zero input bit are processed normally, a resulting output value will be computed that's equivalent to the value produced by the above-described filter wherein each zero is processed as −1. This is because each tap weight that corresponds to an input one bit will cause twice its correct weight, i.e., $2h_k$, to be added to the output accumulator: however there will also have been a corresponding $-h_k$ amount present in the sum from the $-\Sigma h_k$ initial bias. Similarly, when a tap weight corresponds to a zero input bit, nothing is added to the output accumulator as that is exactly what's needed—there's already a $-h_k$ value present as a component of the initial bias. By skipping the add/subtract operation for all tap weights $h_k$ corresponding to a zero input bit, we can save computational effort; that is, power savings can result. If it could be assured that, in the computation of each output bit, at least half the input data bits were zero, then a saving of at least 50% of the required computation could be assured. Alternative arrangements for this biased accumulation are also possible. We could, for example, use a filter having the structure of FIG. 4 but with modified tap weights, and the effects of the bias value could be incorporated into the subsequent circuitry that process the output samples produced. In particular, a filter could be used in which doubled tap weights are employed and the bias value is added to the final accumulated value, as shown in FIG. 5B, or in which the plurality of summing elements 504, 416, 436, 446, and 456 are replaced by an accumulator 570, as shown in FIG. 5C.

For many types of communication systems, there are certain processes that the incoming data go through which ensure that the one and zero bits appearing in the pulse-shaping filter's input will occur with equal likelihood. If that situation applies then we can simply build a system employing the above-described technique and we'll be assured that, on average, about half the add/subtract operations would be saved, thereby lowering the power dissipation proportionally. Suppose, however, we desire to ensure that such savings occur for any input sequence. Suppose, that we also want to ensure that at most N/2 add/subtract operations are required in the computation of each output sample—no matter what input sequence was being processed. It might at first seem impossible to accomplish that goal since, for example, an input sequence of all ones could be encountered.

However, since it must certainly be the case that there will be a majority of either ones or zeros in any input sequence, we just need to be able to deduce which situation applies as each output bit is being computed; and we can, in fact, be assured of needing at most N/2 add/subtract operations. This is accomplished with a circuit for determining whether the majority of the input values are zero or non-zero.

When the majority input-bit type is zero, we of course use the system already described. When the majority input-bit type is non-zero (ones, for example), a bias of $\Sigma h_k$ can be employed, and we only perform an add/subtract operation for those tap weights corresponding to a zero input bit. This approach requires that only addition operations be employed when the bias is $-\Sigma h_k$ and only subtraction operations when the bias is $\Sigma h_k$. In all cases, add/subtract operations are performed for at most N/2 tap weights.

A variation on this system design that sometimes might be more attractive is to always employ a $-\Sigma h_k$ bias and always perform additions, no matter what the majority input data type, but to perform a negation on the final accumulated output value whenever the input-bit-type majority is one. (Depending on accuracy requirements, a simple conditional bit-inversion—i.e., ones' complement negation—might suffice.)

Given the foregoing, a system may be constructed wherein we know that we must perform at most N/2 add/subtract operations in the computation of each output data sample. Another filter design advantage might ensue from such a system: If the maximum speed of the summation elements being employed is a limiting factor in determining the maximum length of the pulse-shaping filter—for a given input data rate—this computational savings can be recognized as a means of saving processing time, thereby permitting the use of longer filters (or, as a means of building filters that run at higher data rates).

Rather than employing a biased summation, an alternative implementation would consist of pairing-up tap weights—storing, say, $h_0+h_1$, and $h_0-h_1$, rather than $h_0$ and $h_1$. Then, a single add/subtract operation of one of these two values would suffice for both taps' contributions to the filter's output value. While this approach would also halve the number of add/subtract operations, while not increasing data storage requirements and not requiring circuitry for determining the majority bit type, it would, however, require bit-type analysis circuitry on each pair of taps and it would not seem to provide the option we've just mentioned of never requiring subtractions. Furthermore, it would always require approximately N/2 add/subtract operations whereas the method we've outlined requires at most N/2 , depending on the data.

While we've been focusing on pulse-shaping filters, the technique of using a bias offset and performing only half the additions normally needed can also be employed in the design of many other kinds of filters, including for example, digital filters associated with sigma delta analog to digital converters (such as that which is disclosed in U.S. Pat. No. 4,746,899, issued to Swanson et al. on May 24, 1988, which is hereby incorporated by reference). In the system disclosed in the Swanson reference, the filter can be implemented using the foregoing technique by, for example, simply using the $-\Sigma h_k$ bias and doubling tap coefficients. Then, the need to store or create negated tap coefficients and to multiplex (mux) the possibly negated tap coefficients can be avoided, thereby saving hardware. This technique can be used in filters that process one-bit data treating an input zero bit as zero rather than −1. In this case we design the same kind of system we've described previously, but the tap coefficients are not doubled and the bias value is either zero or $\Sigma h_k$ depending on whether the majority input bit type is zero or one. When zeros are in the majority at most N/2 additions are performed, and with a majority of ones present it's at most N/2 subtractions. Alternatively, by using a bias offset of zero or $-\Sigma h_k$ and conditionally negating the output value, we can build the filter in a way that always performs at most N/2 additions (i.e., no subtractions are required).

Finding the Majority Input Bit Type

Figure 5D:
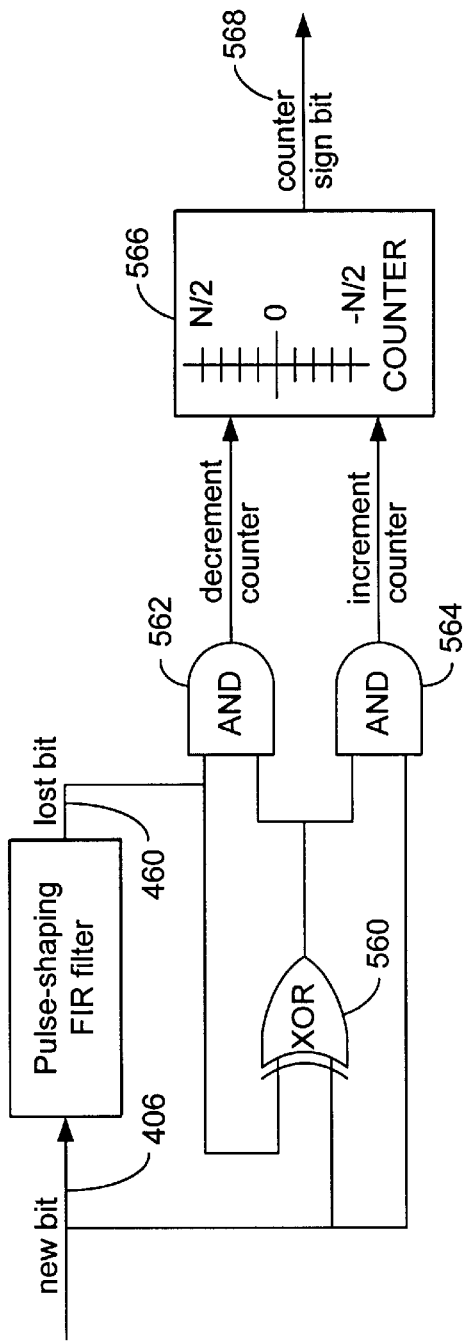
FIGS. 5D and 5E are block diagrams showing a mechanisms for determining the majority input-bit type.

FIG. 5D is a block diagram of a circuit for determining the majority input-bit type. This circuit performs the task of determining, at the time each output bit is to be computed, whether the majority of input bits involved in the pulse-shaping filter's processing are ones or zeros. Various techniques might be employed to do this, for example: Let's start the system with, say, all zero bits at the outputs of the delay chain elements such as the delay elements 404, 432, 440, and 452 illustrated in FIG. 5A. (These are the system's "initial conditions" and no matter how the system is built, or what values they are given, the first N−1 data output values, but only those values, would be affected by this choice.) The system for determining the majority input bit type includes a counter 566, and a logical circuit having an "exclusive or" gate 560 and two "and" gates 562 and 564 coupled to the digital filter 500. The counter 566 is capable of counting from −N/2 to N/2 if N is even, and from −(N+1)/2 to (N−1)/2 if N is odd, and is initialized to a value of −N/2 or −(N+1)/2, respectively. As each new input data bit is encountered by the pulse-shaping finite impulse response (FIR) filter 500, all the previous data bits are shifted across the top delay chain, resulting in a bit being "lost" from the delay output of the last stage in the filter 500. As this occurs, the counter 566 needs to be updated to reflect how the new input bit and the loss of the old input bit affects the majority input bit type. When two zero bits occur as the new bit and the lost bit, or when two one bits occur, the counter 566 is not updated, as no change will have occurred in the majority of input bits present—in fact, the total number of one and zero bits will not have changed, just their locations. When a new one bit comes in and a zero bit is lost, however, the logic provided by the "exclusive or" gate 560, and the "and" gates 562 and 564, increments the counter 566. Similarly, the counter 566 is decremented when the new bit is a zero and the lost bit is a one. After each counter 566 update we can just interrogate the counter's sign bit 568 to learn whether the input data currently being processed have a majority of ones or a majority of zeros.

Figure 5E:
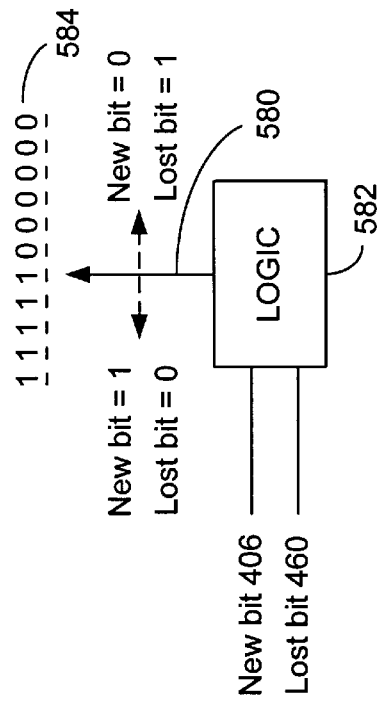

FIG. 5E shows another mechanism that can be employed to determine the majority input-bit type. The mechanism uses the new bit 406 and the lost bit 460, and logic 582 to logically position a pointer 580. When the new bit and the lost bit are different, the pointer is repositioned to reflect the new majority input bit type. For example, when the new bit 406 is a "1" and the lost bit is a "0," the pointer is moved to point at a different register 584. In FIG. 5E, for example, the pointer 580 is moved to the left, whereas if the new bit 406 is a "0" and the lost bit is a "1," the pointer 580 is moved to the right.

Figure 6A:
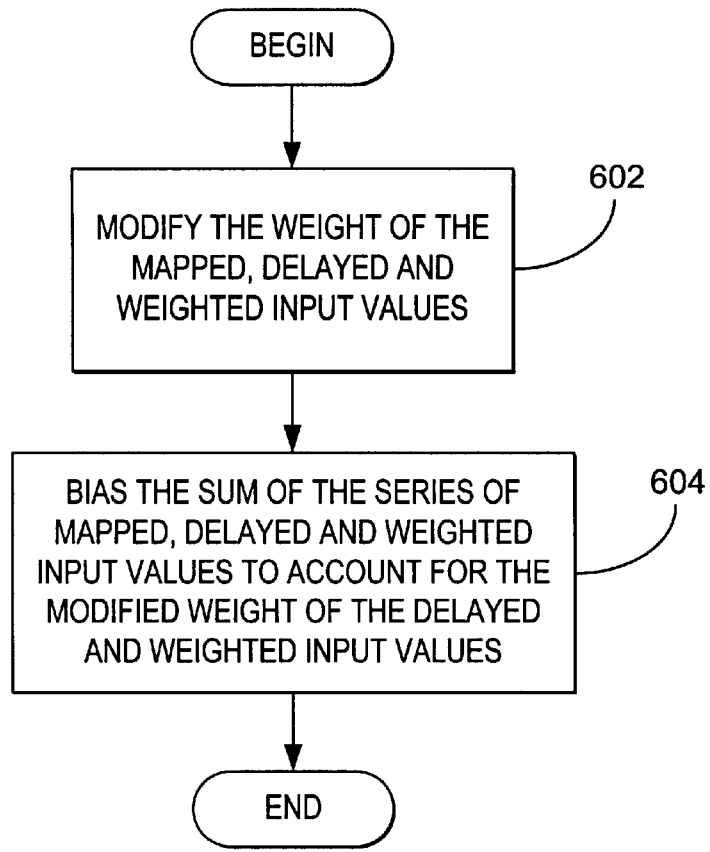
FIGS. 6A–6E are flow charts presenting exemplary steps used to practice low-power pulse-shaping digital filtering.

FIGS. 6A is a flow chart illustrating exemplary process steps that can be used to develop the foregoing digital filter. First, a digital filter has been defined that implements a sum of a series of input values that are delayed and weighted by weights $\{h_0, h_1, \ldots, h_{N-1}\}$ to provide the desired digital filter response. Then, this digital filter is modified by mapping the input values (e.g. from {−1, 1} to {0, 1}), modifying the weights $\{h_0, h_1, \ldots, h_{n-1}\}$ and by biasing the sum of the delayed and weighted input values. This is depicted in blocks 602 and 604.

Figure 6B:
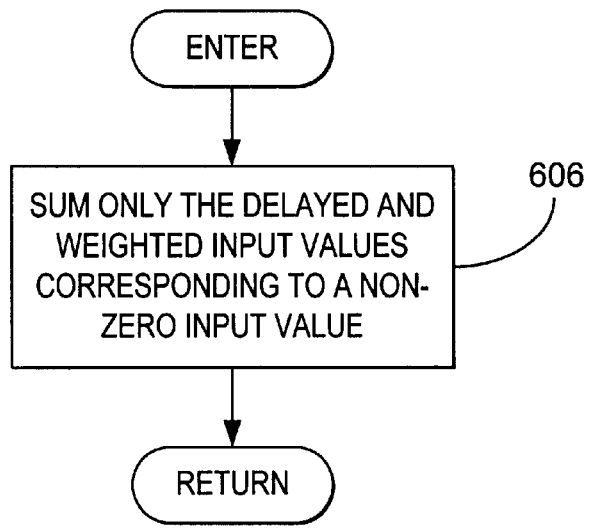

FIG. 6B is a flow chart illustrating additional exemplary process steps that can be used to practice the foregoing digital filter. By modifying the input values or the weights $\{h_0, h_1, \ldots, h_{N-1}\}$ properly, many of the values that would otherwise be weighted by weights $\{h_0, h_1, \ldots, h_{N-1}\}$ are zero, and add nothing to the digital filter output. In such cases, these operations may be skipped by summing only those delayed and weighted input values that are non-zero. This is depicted in block 606.

Figure 6C:
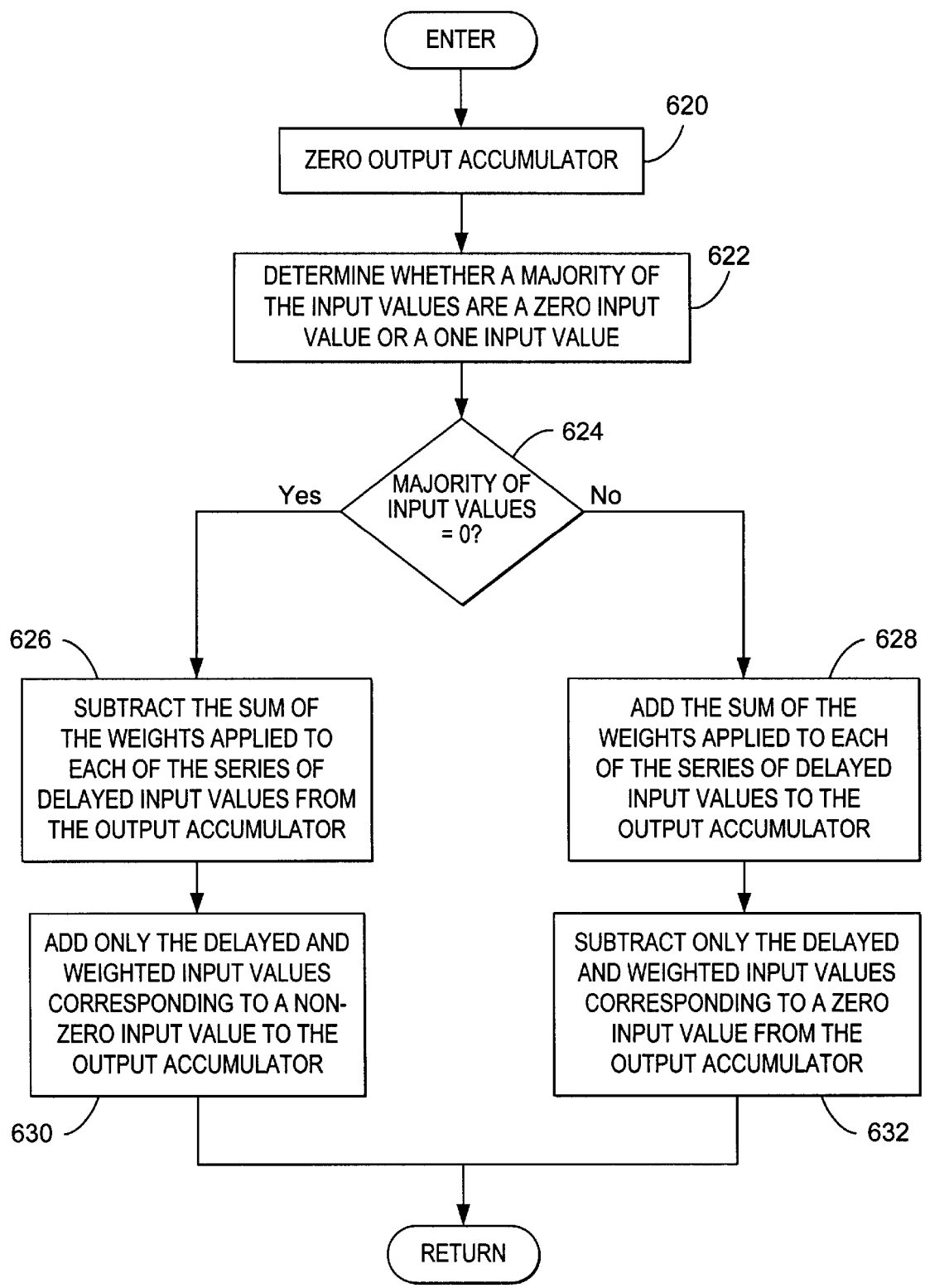

FIG. 6C is a flow chart illustrating additional exemplary process steps that can be used to practice the foregoing digital filter. After zeroing 620 the output accumulator, a determination of the majority input bit-type is performed, as shown in block 622. If the majority of input values is zero, the sum of the weights $\{h_0, h_1, \ldots, h_{N-1}\}$ applied to each of the series of delayed input values is subtracted from the output accumulator, and only the delayed and weighted input values corresponding to non-zero input values are summed, as shown in blocks 626 and 630. If, however, the majority of input values are non-zero (i.e. "1" for an input stream comprising only ones or zeros), the sum of the weights $\{h_0, h_1, \ldots, h_{N-1}\}$ applied to each of the series of delayed input values is added to the output accumulator, and only the delayed and weighted input values corresponding to zero input values are subtracted from it, as shown in blocks 628 and 632. The result is a savings of additions/subtractions, and consequently a power savings. When actual multiplication operations are employed in computing the delayed and weighted input values, additional savings may be realized by skipping the tap multiplication operations for zero values.

Figure 6D:
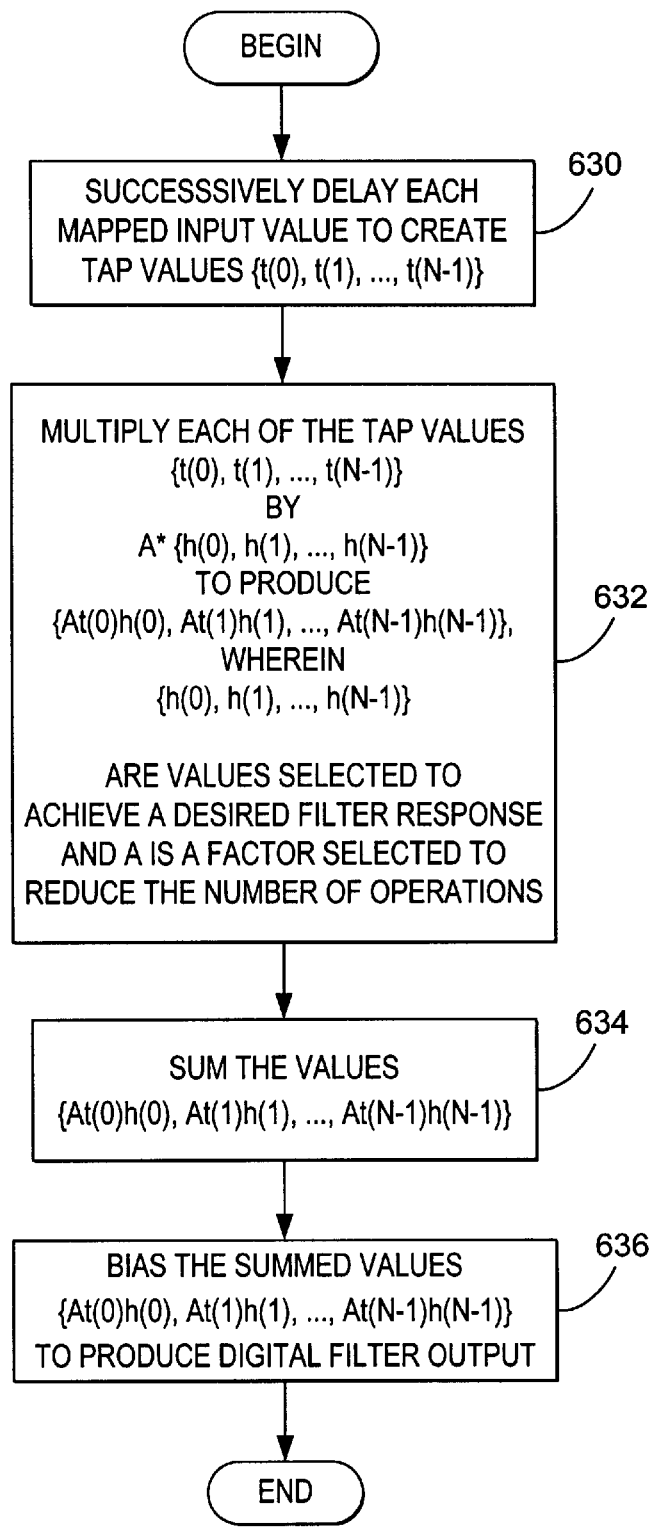

FIG. 6D is a flow chart illustrating the process steps to filter a series of input values $\{x_0, x_1, \ldots, x_{N-1}\}$. First, each input value is successively delayed and mapped to an appropriate sequence of tap values $\{t_0, t_1, \ldots, t_{N-1}\}$, as shown in block 630. For example, the input sequence {1, −1, −1, 1, −1} maps to the sequence {1, 0, 0, 1, 0} as $\{x_0, x_1, \ldots, x_{N-1}\}$ maps to $\{t_0, t_1, \ldots, t_{N-1}\}$. In this case, the factor A is selected as 2. Similarly, the input sequence {1, −1, −1, 1, −1} may be mapped to the sequence {2, 0, 0, 2, 0}, in which case, the factor A is selected as 1.

Next, the tap values are multiplied by $A \cdot \{h_0, h_1, \ldots, h_{N-1}\}$ to produce $\{At_0 h_0, At_1 h_1, \ldots, At_{N-1} h_{N-1}\}$, as shown in block 632. The values $\{h_0, h_1, \ldots, h_{N-1}\}$ are weight values selected to achieve a desired filter response, and A is a factor selected to reduce the number of operations performed in filtering the input data stream. Then, the values $\{At_0h_1, At_1h_1, \ldots, At_{N-1}h_{N-1}\}$ are summed 634, producing $$\sum_{k=0}^{N-1} At_k h_k.$$

A bias is then applied 636 to the summed values to produce the digital filter output to compensate for the modified $\{At_0h_0, At_1h_1, \ldots, At_{N-1}h_{N-1}\}$ values in the digital filter.

Figure 6E:
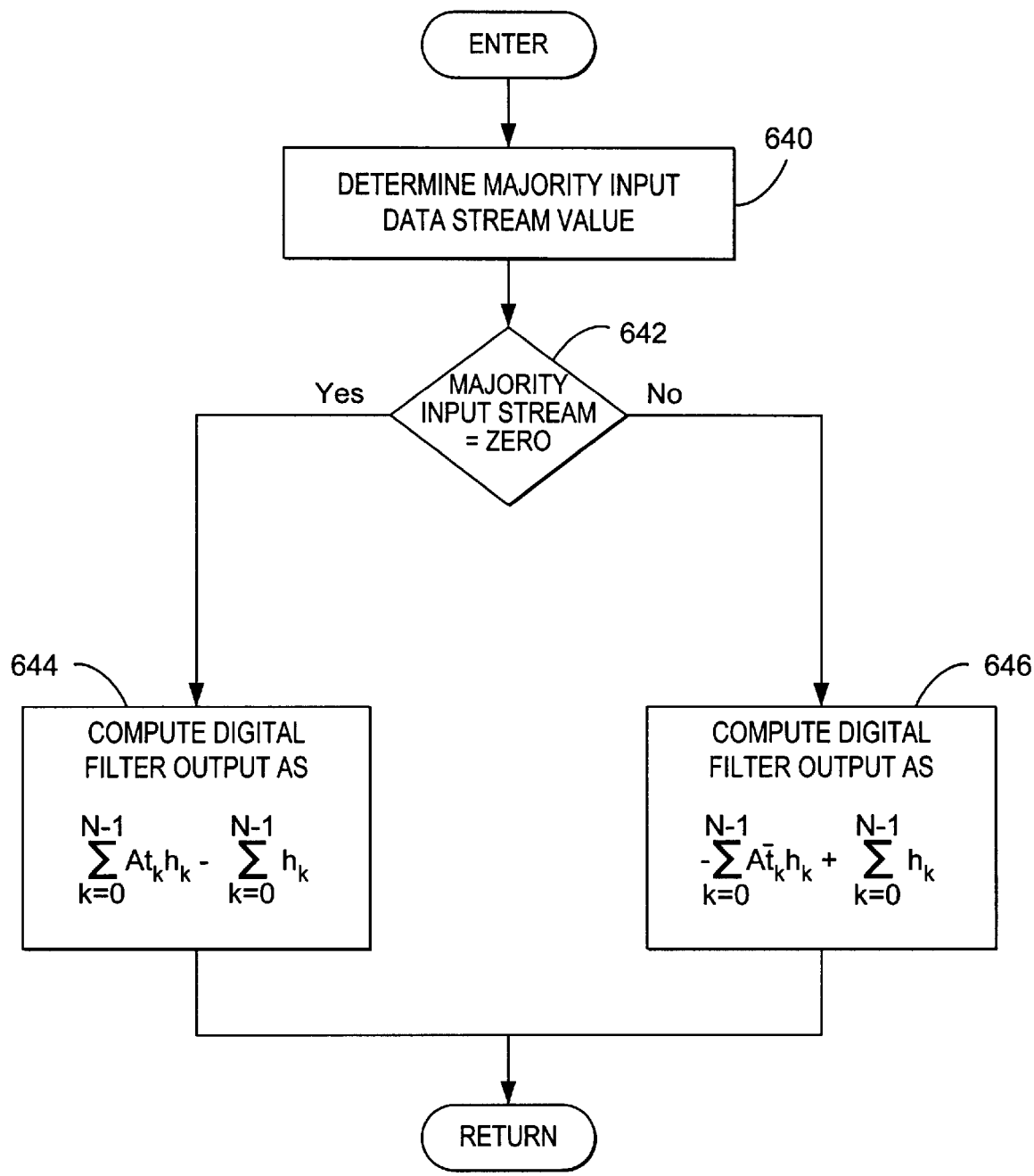

FIG. 6E is a flow chart illustrating further process steps used in one embodiment of the present invention where the mapped input data has the values $\{0, 1\}$. First, the majority input bit type is determined 640. Then if the majority of the bits in the mapped input stream tk are zero, the digital filter output is computed as $$\sum_{k=0}^{N-1} At_k h_k - \sum_{0}^{N-1} h_k.$$

If, however, the majority of the bits in the input stream are non-zero, the digital filter output is computed as $$-\sum_{k=0}^{N-1} A\bar{t}_k h_k + \sum_{k=0}^{N-1} h_k,$$

where $\bar{t}_k$ denotes the inversion of bit $t_k$.

Application to BPSK and OPSK Modulation

The system described above is appropriate for a binary phase-shift keying (BPSK) modulation system. Another popular type of digital modulation system is quadrature phase-shift keying (QPSK).

Figure 7:
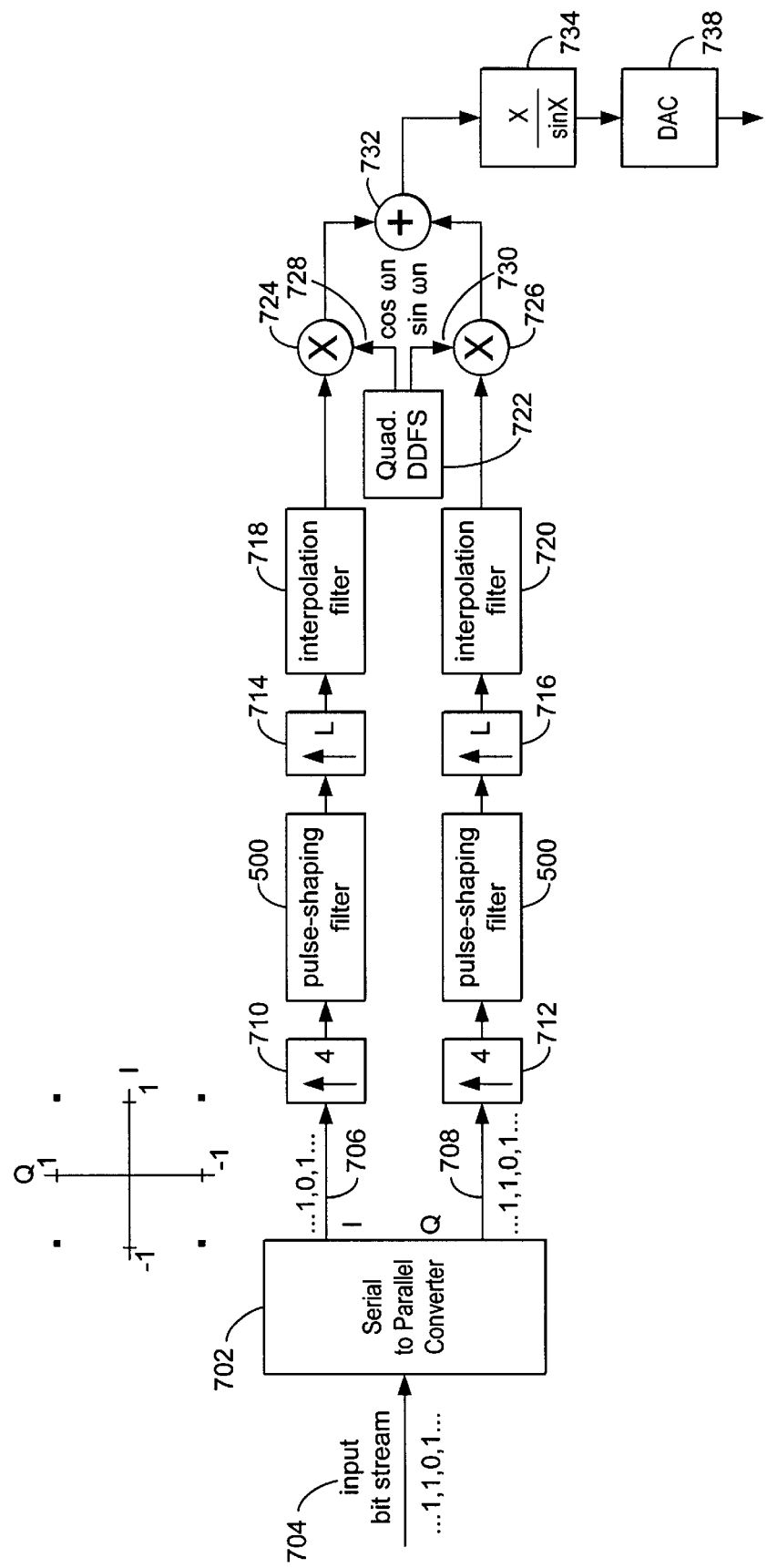
FIG. 7 is a block diagram showing application of the low-power pulse-shaping digital filter to a QPSK modulation system.

FIG. 7 is a block diagram of the application of the low-power pulse-shaping digital filter to a QPSK modulation system. In a QPSK system, pairs of bits are taken from the input bit-stream 704, and each bit of a pair is processed by one of two separate channels, called the in-phase (I) channel 706 and the quadrature (Q) channel 708. The data rate for each of the two channels 706 708 is half the input data 704 rate. FIG. 7 shows additional components frequently found in such systems, such as interpolation filters 718, 720 and digital frequency synthesizers 722, but the basic operation of each pulse-shaping filter 500 can proceed as we've described above. That is, we just build two such pulse-shaping filters 500, one for each channel, or time share a single filter.

Application to QAM Modulation

Figure 8:
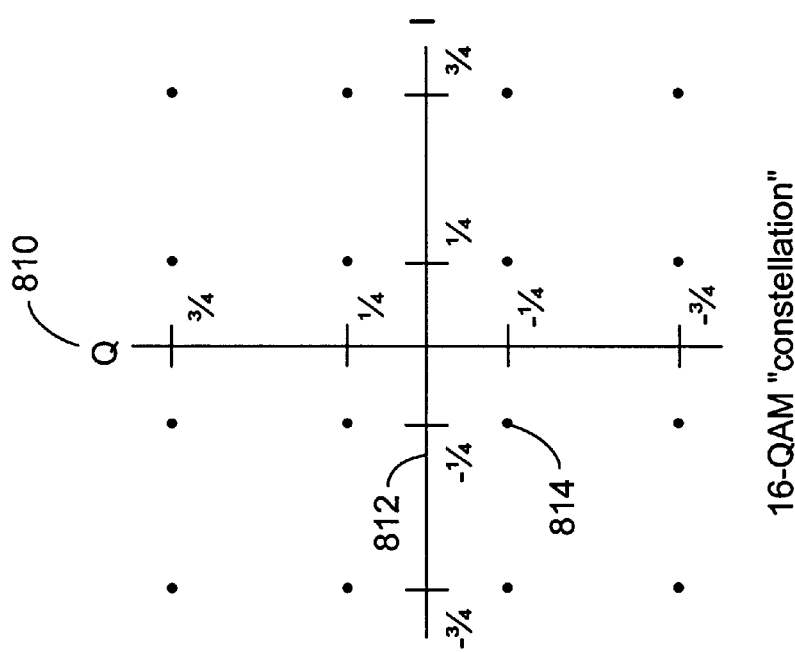
FIG. 8 is a block diagram showing a 16-QAM modulation scheme.
Figure 8:
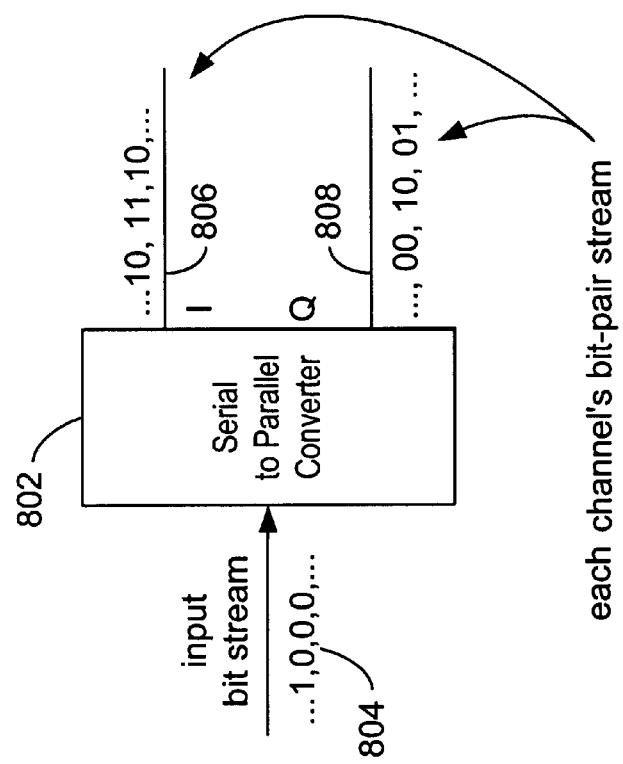

FIG. 8 is a diagram showing an increasingly popular modulation scheme: quadrature amplitude modulation (QAM). QAM can be implemented in various degrees of sophistication. FIG. 8 illustrates "16-QAM," which takes four data bits at a time from the incoming bit-stream 804, i.e., processes four-bit "symbols" and forms each four-bit symbol into two bit-pairs, sending one bit-pair onto each of the I channel 806 and the Q channel 808. The constellation diagram of FIG. 8 shows how the four amplitude modulation levels for each channel can be associated with the 16 equally-spaced points (16 symbols) in the I-Q plane defined by the quadrature axis 810 and the in-phase axis 812. Now, unlike QPSK (which can be considered "4-QAM"), we require more elaborate pulse-shaping filters so that the two-bit data can be handled.

Figure 9:
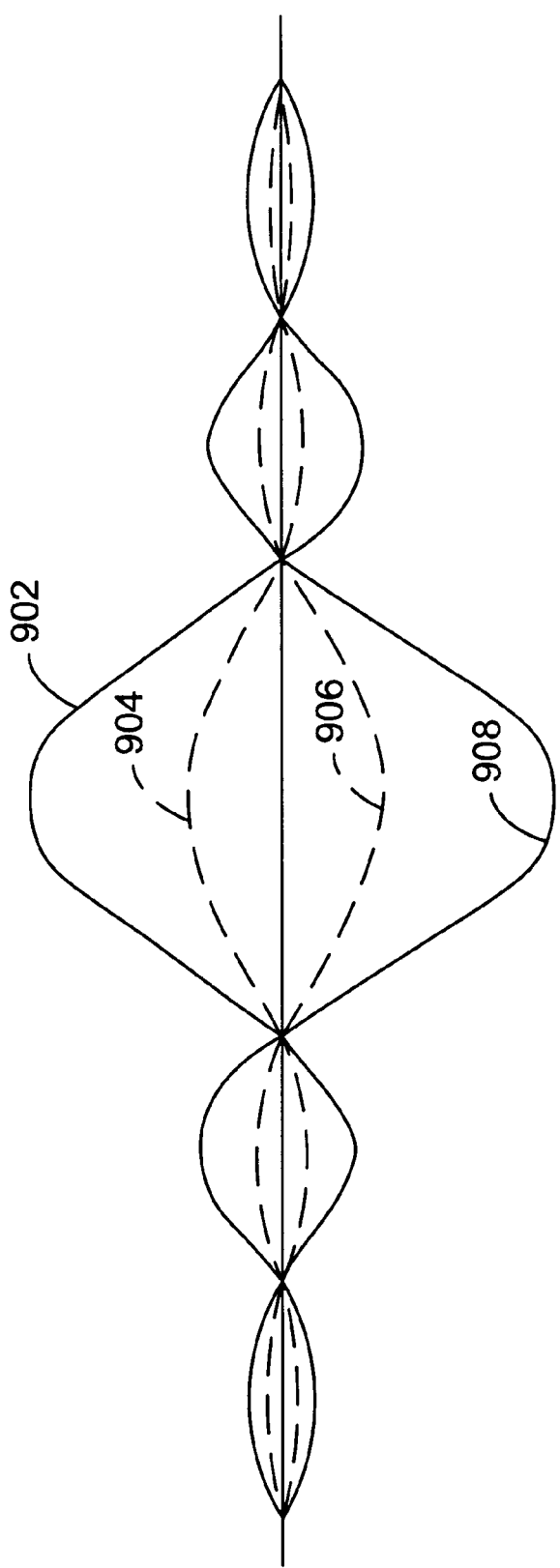
FIG. 9 is a diagram illustrating four possible impulse responses for each channel's bit pair in a 16-QAM system.

FIG. 9 shows that each channel's pulse-shaping filter (and the subsequent fixed digital and analog processing) must produce one of four possible responses, 902, 904, 906, and 908, depending on the particular bit-pair being processed. These responses require scaled copies of the type of pulse-shaping filter response already discussed.

A very straightforward approach to implementing these pulse-shaping filters would be to build a simple FIR filter employing tap multipliers that accept signed three-bit input data (which conveniently encodes the values $\pm\frac{1}{4}$ and $\pm\frac{3}{4}$). While conceptually simple, this would be somewhat wasteful since two-bit data on each channel should be employable as each channel's symbols have only four possibilities at each discrete time point. It would also be desirable to employ multiplierless filters, as we did previously. That can be accomplished as follows:

In a manner similar to the QPSK case, where each bit in a channel's bit-stream uses the zero state to represent the negative of the one state (i.e., "1" means one, and "0" means $-1$) we treat each of the two bits of each 16-QAM channel similarly. For example, denoting the bit-pair of a channel's pulse-shaping filter by ab we can define the values of these bits as follows:

$$a = \begin{cases} 0 \text{ means } -1/2 \\ 1 \text{ means } 1/2 \end{cases}$$

$$b = \begin{cases} 0 \text{ means } -1/4 \\ 1 \text{ means } 1/4 \end{cases}$$

Then, for the bit-pair ab we have the relationship described in Table I below:

TABLE I

| a | b | |
|---|---|---|
| 1 | 1 | ¾ |
| 1 | 0 | ¼ |
| 0 | 1 | −¼ |
| 0 | 0 | −¾ |

Notice that this encoding of the bit-pairs ab is for the convenience of the filter design. It would be an easy matter to implement in logic circuitry a translation table that identifies other desired bit-pair patterns with the bit-pair patterns associated with the numbers $\pm\frac{1}{4}$ and $\pm\frac{3}{4}$ in the above table.

Figure 10:
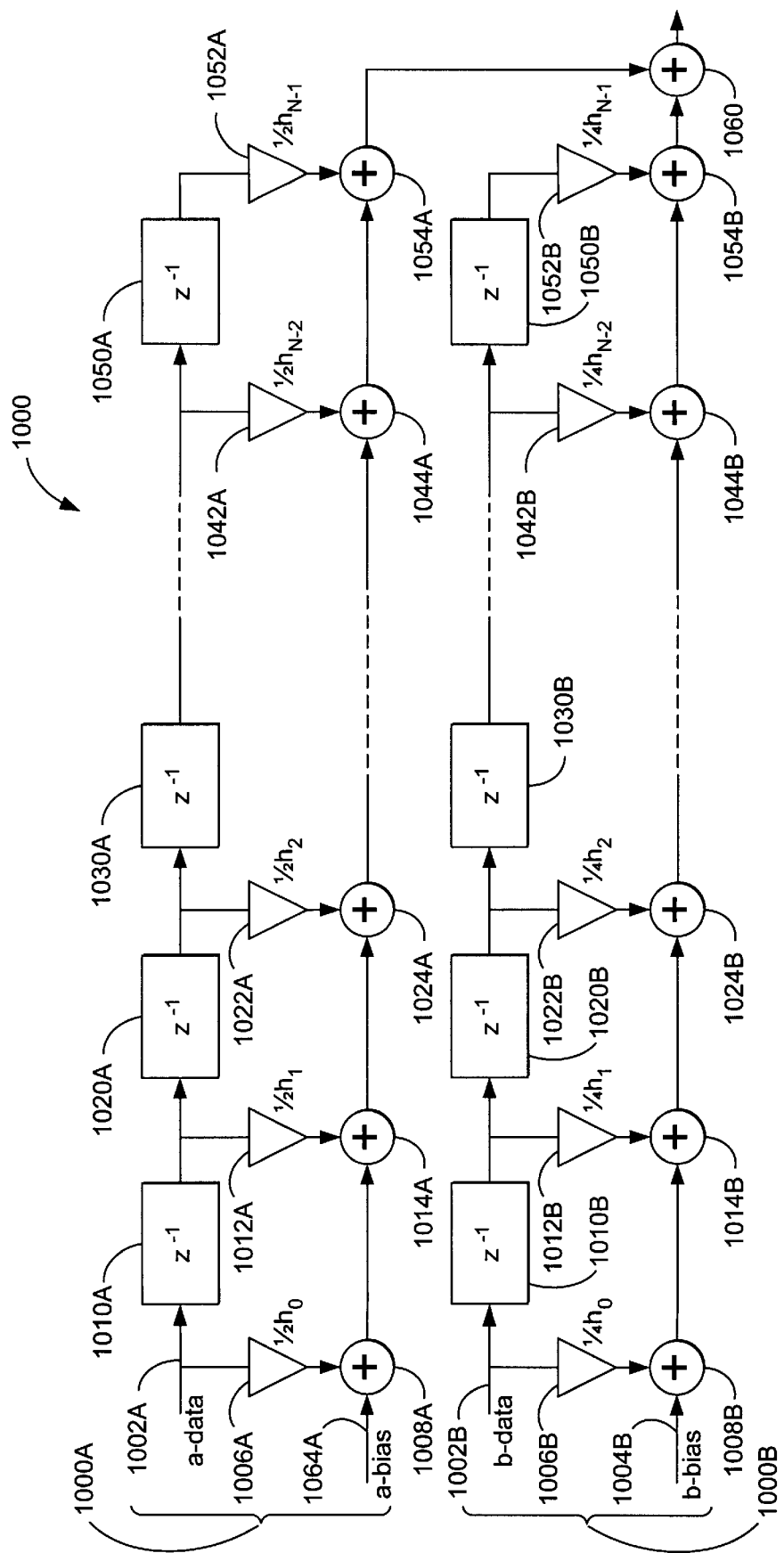
FIG. 10 is a block diagram showing a bias added to an N-tap finite impulse response pulse-shaping filter for one 16-QAM channel.

FIG. 10 is a block diagram showing how this encoding can be used to implement two multiplierless FIR filters in the manner previously described. Here, one filter 1000A accepts the one-bit a-data and the other filter 1000B accepts the one-bit b-data. The a-data tap-coefficients are modified from their normal values as follows: First, we use $(\frac{1}{2})h_k$ for the coefficients $h_k$ of the a-data filter 1006A, 1012A, 1022A, 1042A, and 1052A, and $(\frac{1}{4}) h_k$ for the coefficients $h_k$ of the b-data filter 1006B, 1012B, 1022B, 1042B, and 1052B. With the understanding that these are the values of the two filters' coefficients, in terms of the actual filter-tap values, but continuing to refer to the coefficients of these two filters simply as $h_k$, the same manipulations, i.e., using $-\Sigma h_k$ and $2h_k$, etc., can be employed to obtain low-power implementations of the 16-QAM filters. One adder 1060 needs to be employed to combine the output bit-streams of the a-data and the b-data filters, as shown in FIG. 10.

The same principles can be applied to other QAM systems. For 64-QAM, for example, we just require three separate multiplierless filters on each channel: An a-data filter, a b-data filter, and a c-data filter, where the filter coefficients are scaled by ½, ¼, and ⅛, respectively.

A variation on this system design that might be advantageous is to keep all channels' coefficients the same—i.e., let the a-channel, b-channel, etc., all have the original $h_k$ tap weights, and let all channels process the input data as described for the simple BPSK case. Then, when the channels' outputs are added together, it would be a simple matter to employ hard-wired shifts to account for the different weightings (e.g., ½, ¼ . . . ) on the different channels. A further extension of this variation would be to employ just a single filter channel, with the a-data, b-data, etc. interleaved or time-multiplexed to obtain the equivalent of multiple channels.

Application to Linear-Phase Filters

Figure 11:
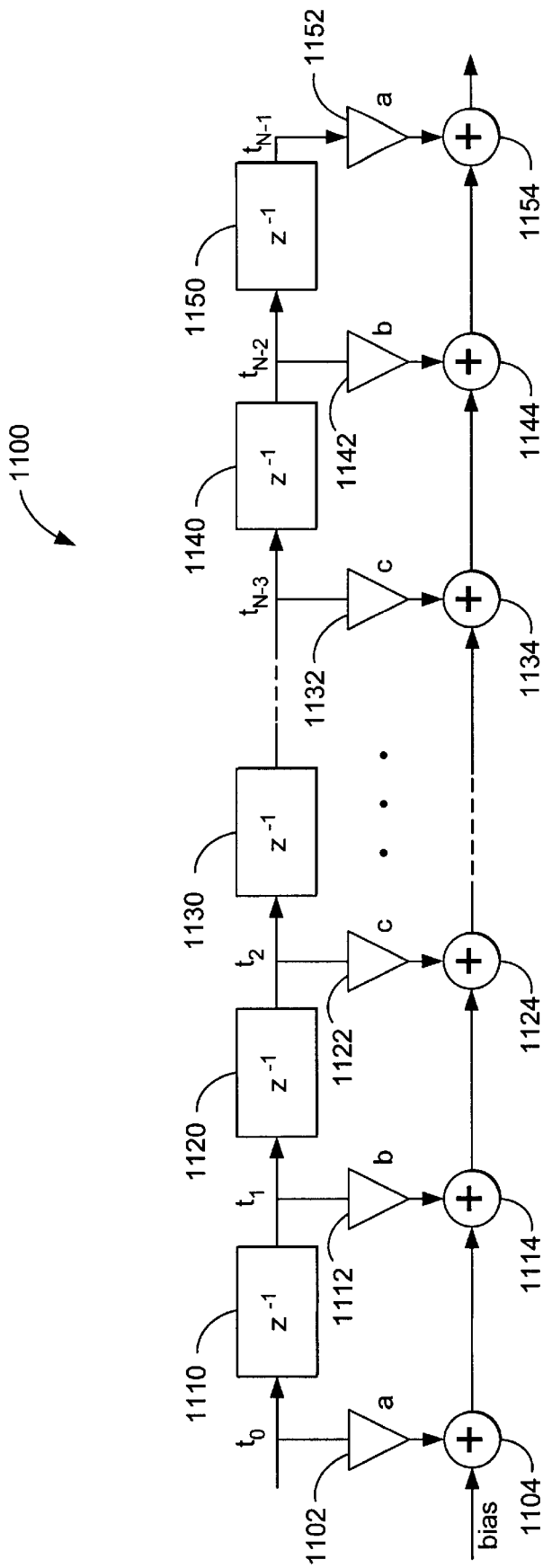
FIG. 11 is a block diagram of an exemplary linear-phase finite impulse response digital filter.

FIG. 11 shows application of the low-power pulse-shaping filter principles described above to a linear phase digital filter 1100. In a linear-phase digital filter, the tap weights $\{h_0, h_1, h_2 \ldots, h_{N-3}, h_{N-2}, h_{N-1}\}$ described earlier have even (or odd) symmetry. That is, they can be defined as one or more tap weight pairs $\{h_{i-1}, h_{N-i}\}$ wherein $h_{i-1} = h_{N-i}$ (or $h_{i-1} = -h_{N-i}$) for $i=\{1,2,3, \ldots, N/2\}$ when N is even and $i=\{1,2,3, \ldots, (N+1)/2\}$ when N is odd, with each tap weight pair $\{h_{i-1}, h_{N-i}\}$ associated with a tap value pair $\{t_{i-1}, t_{N-i}\}$. To simplify notation, the gain of each tap weight in a tap weight pair $\{h_{i-1}, h_{N-i}\}$ can be represented by a single gain variable such as gains a, b, and c shown in FIG. 11. Hence, in the even-symmetry case, for example, tap weight 1102 has the same weight as tap weight 1152, tap weight 1112 has the same weight as tap weight 1142 and so on.

In the event that a filter processing a stream of one-bit data (with, as above, zero and one input bits interpreted as ±1) is a linear phase filter (now illustrated by the even symmetry and even number of tap coefficients case, but, in the explanation below, it will be clear that any linear-phase symmetry can also be accommodated through simple changes in the details)—there's no easily apparent way to save on computations by exploiting the linear-phase feature. If the filter were to actually employ multiplication operations, about half the multiply operations could be saved by reorganizing the way in which the additions are performed. But there are no multiplication operations to save when processing one-bit data—so it seems we're required to perform N−1 additions per output sample, just as would be required without linear phase.

As disclosed above, it is possible to reduce these addition operations to at most N/2, but this doesn't in any way exploit the filter's linear-phase feature. It is also possible to take advantage of the symmetric coefficient pattern of the linear phase digital filter to reduce the required number of addition/subtraction operations in such a filter even further . . . to at most N/3.

Consider the possible data-value combinations for the pair of bits associated at some point in time with equal-coefficient taps in the linear-phase filter of FIG. 11. There are three different possibilities: a zero and a one, in which case the taps' contributions to the output sum cancel one another; a pair of ones, in which case we require that twice the common tap value be added to the output sum; and a pair of zeros, in which case we require that twice the common tap value be subtracted from the output sum. In the spirit of the preceding discussion, we can employ biasing offsets to avoid actually performing some of the add/subtract operations. We will want to avoid the computations associated with the largest of the three sets of possible kinds of tap-pairs to achieve the greatest savings. Thus, for $k=0, \ldots, (N/2)-1$, we need to identify the set to which each tap-pair belongs, as follows:

Let $A_k = x(k) \oplus x(N-1-k)$ ($\Rightarrow A_k=1$ if and only if one bit is 0 and one is 1).

Let $B_k = x(k) \cap x(N-1-k)$ ($\Rightarrow B_k=1$ if and only if both bits are 1).

Let $C_k = \text{not}(x(k) \cup x(N-1-k))$ ($\Rightarrow C_k=1$ if and only if both bits are 0).

Since for each k exactly one of $A_k$, $B_k$, $C_k$ is one, we can build circuitry for computing only, say, $A_k$ and $B_k$.

Figure 12:
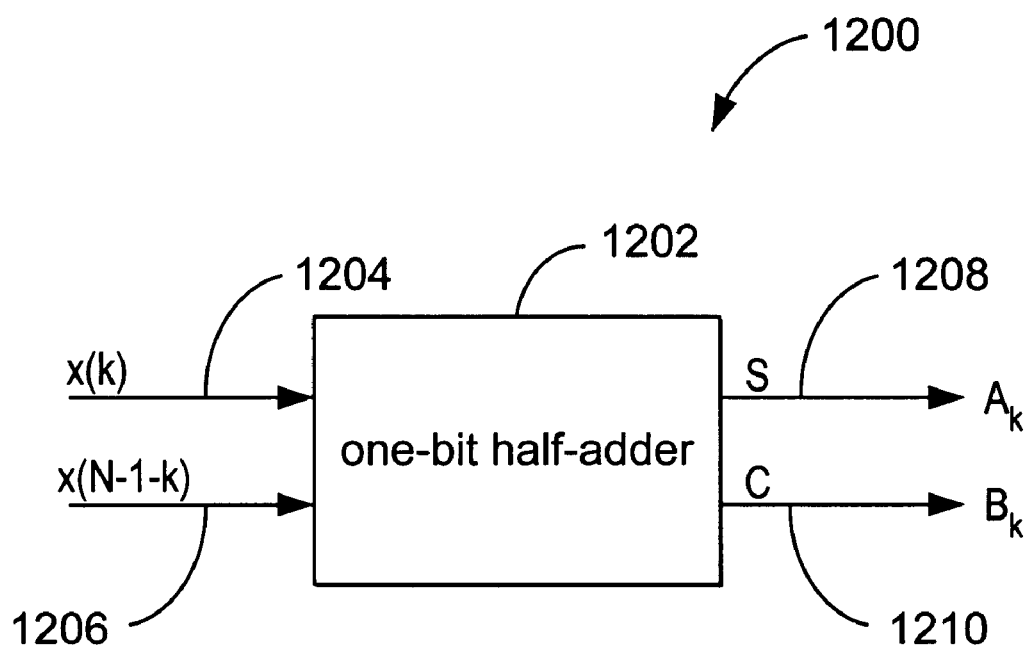
FIG. 12 is a half-adder used to diagnose a bit pattern of a bit-pair x(k),x(N−1−k)

FIG. 12 shows one possible apparatus for computing $A_k$ and $B_k$. The apparatus comprises a half adder 1202. Thus, for N even (although we can also treat the N odd case) we require N/2 half-adders 1202 whose outputs can be used to identify the optimal bias value and the corresponding tap-coefficient modifications that should be used in evaluating the filter's output value. There are three possible cases, as shown in the Table II:

TABLE II

| Case | Bias offset | when $A_k = 1$ | when $B_k = 1$ | when $A_k = B_k = 0$ |
|---|---|---|---|---|
| Case A: (at least 1/3 of the N/2 tap-pairs are 0 & 1) | 0 | — | $2h_k$ | $-2h_k$ |
| Case B: (at least 1/3 of the N/2 tap-pairs are 1 & 1) | $2\Sigma h_k$ | $-2h_k$ | — | $-4h_k$ |
| Case C: (at least 1/3 of the N/2 tap-pairs are 0 & 0) | $-2\Sigma h_k$ | $2h_k$ | $4h_k$ | — |

By employing the computations indicated in the appropriate row of Table II, we can eliminate at least ⅓ of the N/2 tap-pair add/subtract operations. Therefore we must perform at most $(⅔) \times (N/2) = N/3$ add/subtract operations. Notice that, when computing the 2N/3 savings, rounding works in our favor. For example, if we were building a 20-tap linear-phase filter, for any distribution of input data bits across the 20 taps, there would always be (at least) four of the ten tap-pairs that qualify for one of the three cases (A, B, C, in the above table) since each tap-pair must qualify for exactly one case and all three cases therefore can't have at most three tap-pairs. Thus, we need never process more than six add/subtract operations, which yields a 14/20=70% savings in add/subtract operations.

The linear-phase low-power pulse-shaping digital filter also comprises a circuit for detecting that at least ⅓ of the half adder 1202 sum 1208 or carry 1210 outputs are high.

Figure 13:
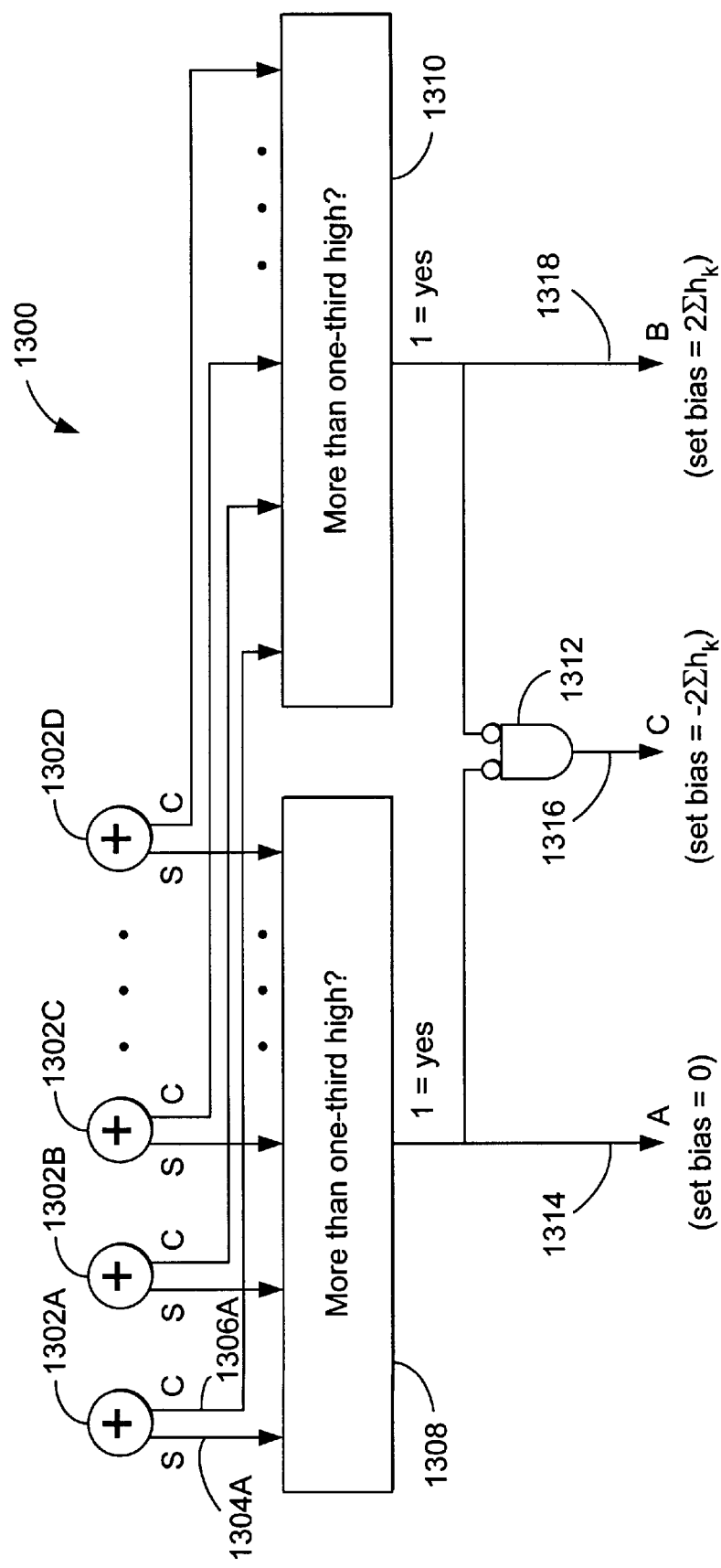
FIG. 13 is a block diagram of an apparatus for finding the majority input bit-pair type.

FIG. 13 is a block diagram illustrating an exemplary system for detecting when at least ⅓ of the half adder 1202 sum or carry outputs are high. Depending on the desired level of complexity in circuit design, the optimal choice between the A or B outputs (should they both be high for some set of input bits) might be made by comparing the actual number of high inputs and selecting the case with the largest number. Alternatively, we might just make an arbitrary choice—say, always pick A 1314. In addition to the circuitry shown in FIG. 13, the individual $S_k$ and $C_k$ bits 1304A and 1306A are also used to select the specific type of add/subtract operation needed for each tap-pair, according to Table II above.

Application to General FIR Filters

It's also possible to employ the techniques discussed above to design completely general FIR digital filters, i.e., filters having B-bit two's-complement input data and M-bit tap-coefficients, where B and M are arbitrary positive integers. Our previous discussion concerning QAM pulse-shaping filters provides a structure for filters employing multi-bit input data that's suitable for this application; however appropriate modifications must be made to ensure that the input-data sign bits are processed correctly. Consider, for example, the input data to be scaled such that it has signed fractional values. That is, let's assume the B-bit input data is of the form $b_0.b_1b_2 \ldots b_{(B-1)}$, where $b_0$ is the sign-bit (having weight −1), $b_1$ has weight ½, $b_2$ has weight ¼, etc. Thus, referring to each one-bit-data filter by the subscript number of its data bit, the tap weights for the bit-n filter (for n=0, 1, . . . , B−1) should be scaled from their original $h_k$ values to become $2^{-n}h_k$ and the corresponding bias offset value for that one-bit-data filter should be, depending on whether the majority of the filter's input bits are zero or one, respectively, either 0 or $2^{-n}\Sigma h_k$ for $n \neq 0$ and either 0 or $-\Sigma h_k$ for n=0 (the sign bit).

Figure 14:
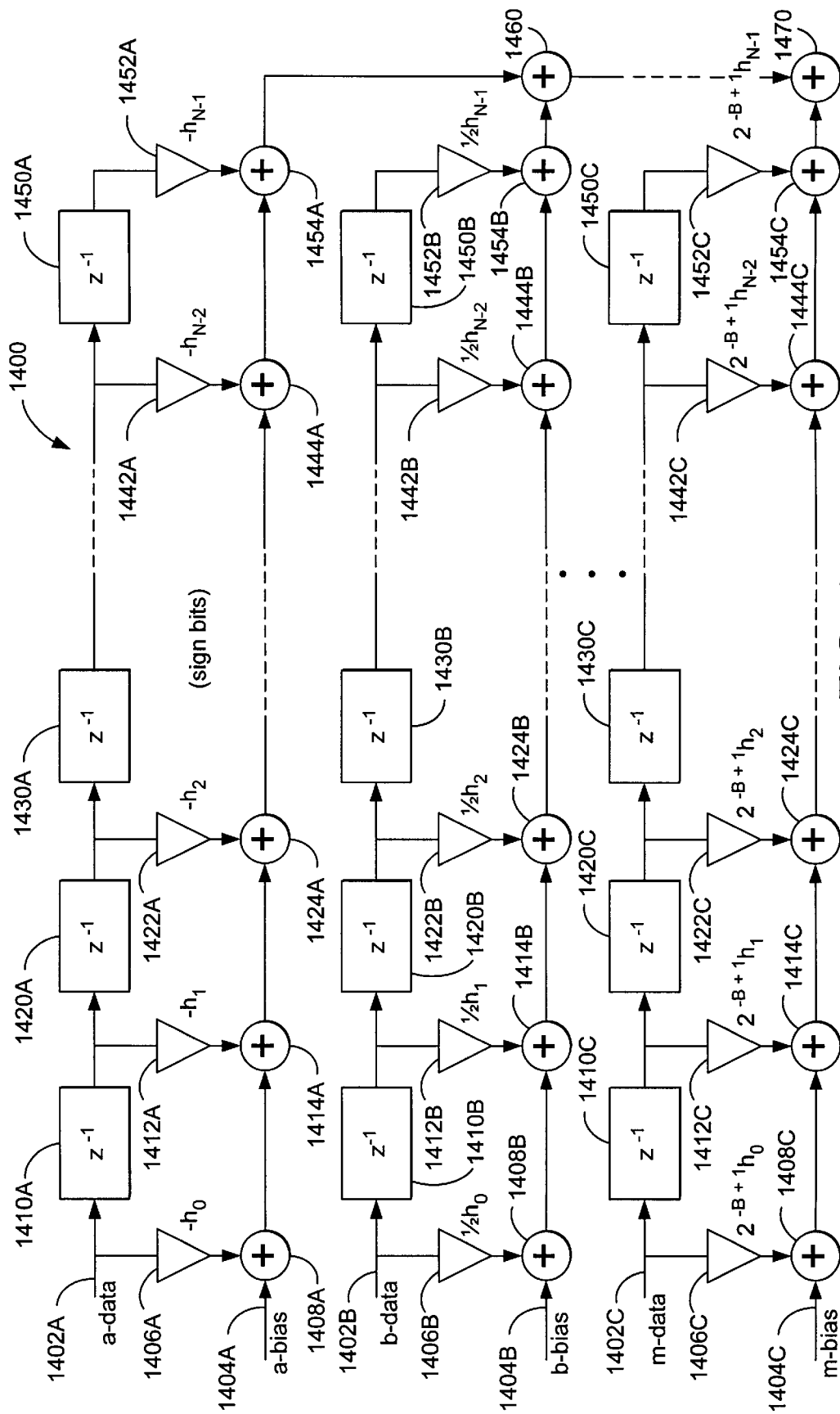
FIG. 14 is a block diagram showing a bias applied to a general N-tap finite impulse response digital filter that processes B-bit two's complement data.

FIG. 14 is a block diagram showing the application of a bias applied to a general N-tap finite impulse response digital filter having B-bit two's-complement input data and M-bit tap-coefficients, where B and M are arbitrary positive integers. Setting aside linear-phase issues for the moment, for an N-tap filter with B-bit data (for N even), (B×N/2)+B−1 (at most) additions are used for the evaluation of each output data sample of the system. This number can be reduced further at the expense of increased data storage and retrieval circuitry, by combining the B bias additions into fewer additions (just one addition, in the extreme) since all these offsets are ultimately accumulated into a common final value. A standard implementation of the same filter using Booth-encoded multipliers (with B even) would require N×[(B/2)−1]+N−1=(NB/2)−1 additions. While these totals are both close to NB/2, the number of operations required in the foregoing implementation is always higher, but only exceeds the Booth total by one add when just a single combined bias value is employed, rather than B such values. (Recall, however, the total for the foregoing implementation is an upper bound on the number of adds that will be performed. The actual number is data dependent, which is not the case for the Booth total.) In an implementation where parallel processing is employed, since different combinations of additions must be performed first (in parallel) before other additions can proceed, the specific sizes of N and B could well be the factor that determines which processing scheme would take less time overall. With both N and B even, the relation that would need to be satisfied for the foregoing approach to yield a faster overall system than the Booth-encoding approach is (N/2)+(B−1)<[(B/2)−1]+(N−1), which is equivalent to N>B+2.

Turning now to the case of general linear-phase FIR filters, the number of additions required for the system depicted in FIG. 14 is (at most) [B×(N/3)]+(B−1) while a Booth-encoded system would require {[(B/2)−1]×N/2}+(N−1) total additions. It can be shown, using these expressions, that the foregoing system requires fewer addition operations when B<6 and N is sufficiently large, namely N>12B/6−B. Again, the comparison becomes even more favorable to our approach when fewer than B (combined) bias offset values are employed. In any event, if the concern is speed, and parallel processing is employed, the foregoing method is faster than the Booth-encoding approach when N/3+(B−1)<1+(B/2−1)+(N/2−1) which can be reduced to the simple relation N>3B.

Application to Transpose FIR Filter Configurations

Figure 15:
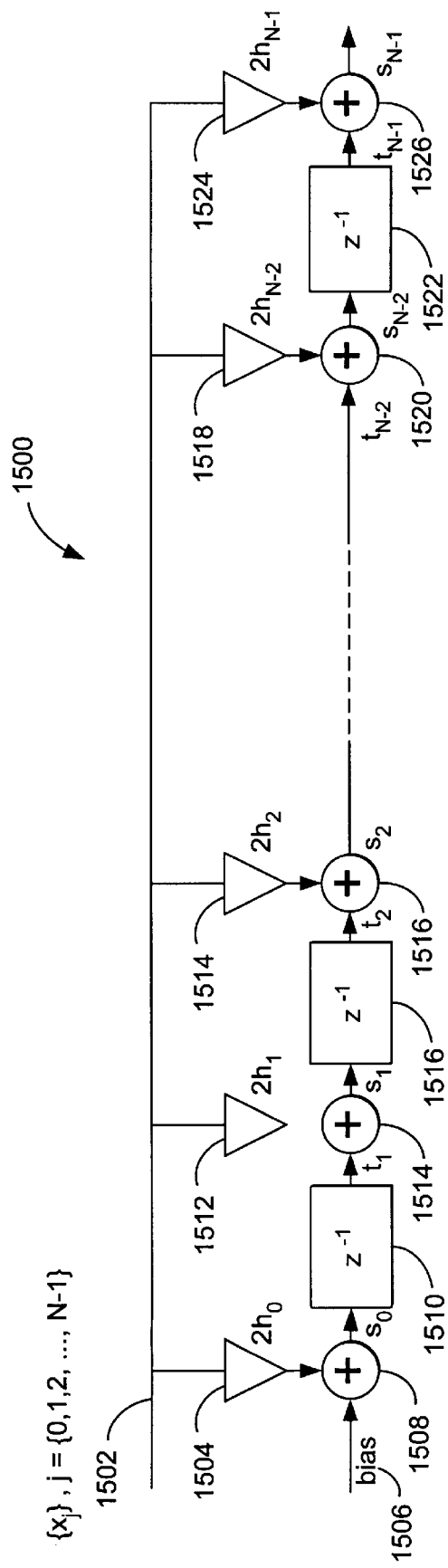
FIG. 15 is a block diagram of a low-power pulse-shaping finite impulse response digital filter in an N-tap transpose configuration.

An example of a transposed FIR filter is shown in FIG. 15. The above-described techniques can be employed for reducing the number of additions in FIR filters while implementing the transposed FIR filter 1500. FIG. 15 illustrates the use of $2h_k$ tap coefficients 1504, 1512, 1514, 1518, and 1524, and a $\pm\Sigma h_k$ bias 1506. A simple version of this system would employ a fixed $-\Sigma h_k$ bias and perform additions only when input values of one appear. Alternatively, an appropriate stream of $\pm\Sigma h_k$ values must be moving along the delay chain at the bottom of FIG. 15 so that, as options to avoid the addition of successive input data-sample values to the sum being accumulated arise, the full advantage can be taken of the data pattern that will be experienced. This is easily arranged if the input bit stream is stored in a shift register prior to its entry into the filter and if the "majority one/zero" decision is made in a manner as described previously, but this time operating on the shift register contents. As each $\pm\Sigma h_k$ bias value must be chosen, we simply refer to this majority circuit's output to determine the best choice based on the input bits that will subsequently be encountered by the filter as its output value is accumulated, starting from the bias value. Alternatively, the bias value can be added to the output data at the filter output, or elsewhere in a manner similar to the variations described for the direct form FIR case.

Figure 16:
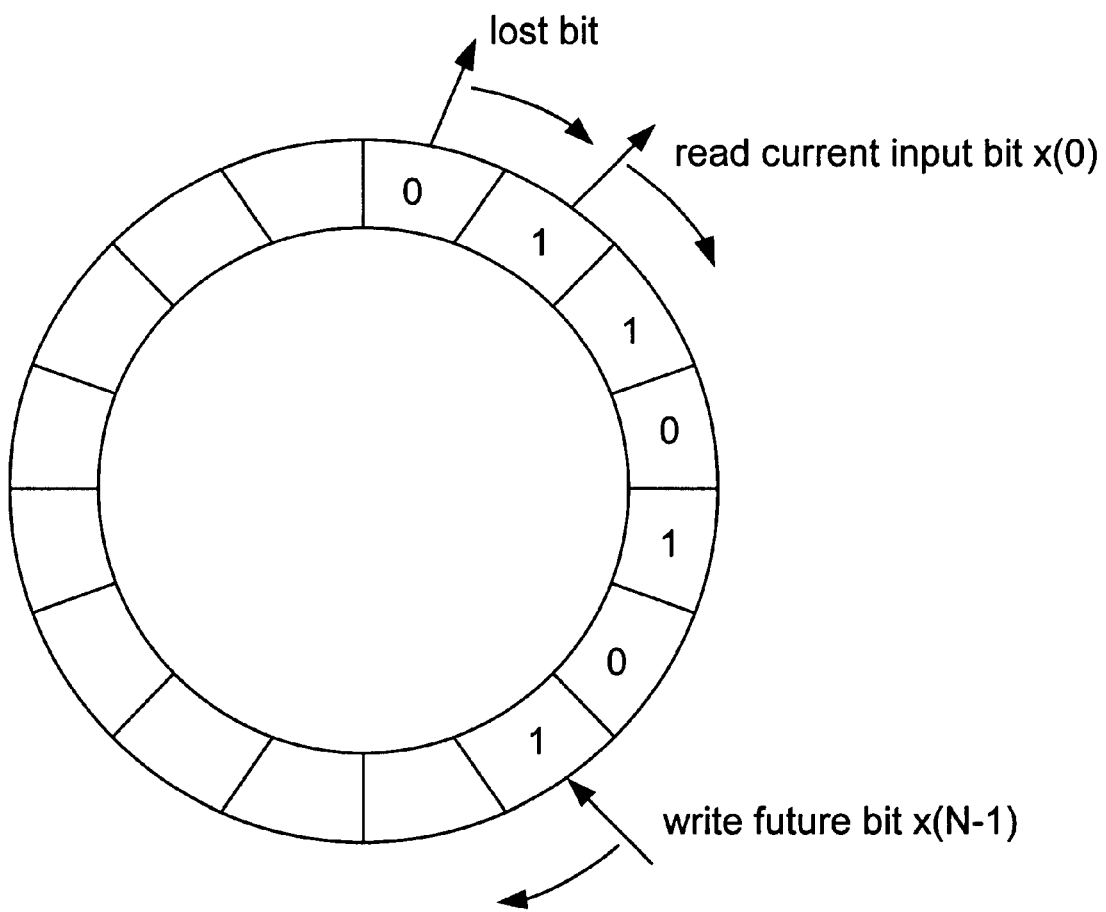
FIG. 16 is a diagram illustrating the circular read-write storage for N future bits.

FIG. 16 is a diagram illustrating a circular read-write storage for N future bits. This circular read/write storage arrangement can be used as an alternative to a standard shift register.

Additional Considerations

Consider a low power, linear phase, interpolating-by-four pulse-shaping filter implemented in polyphase form. The algorithm is independently applied to each polyphase branch. An accumulator is used in each branch to save area, and selective clock generation is applied to save power. Only one of the two cases is processed (that is, the processing of input bits mapped to ones or the processing of input bits mapped to zeros) and the filter coefficients are stored once in a register and routed to each accumulator or summation element.

Figure 17:
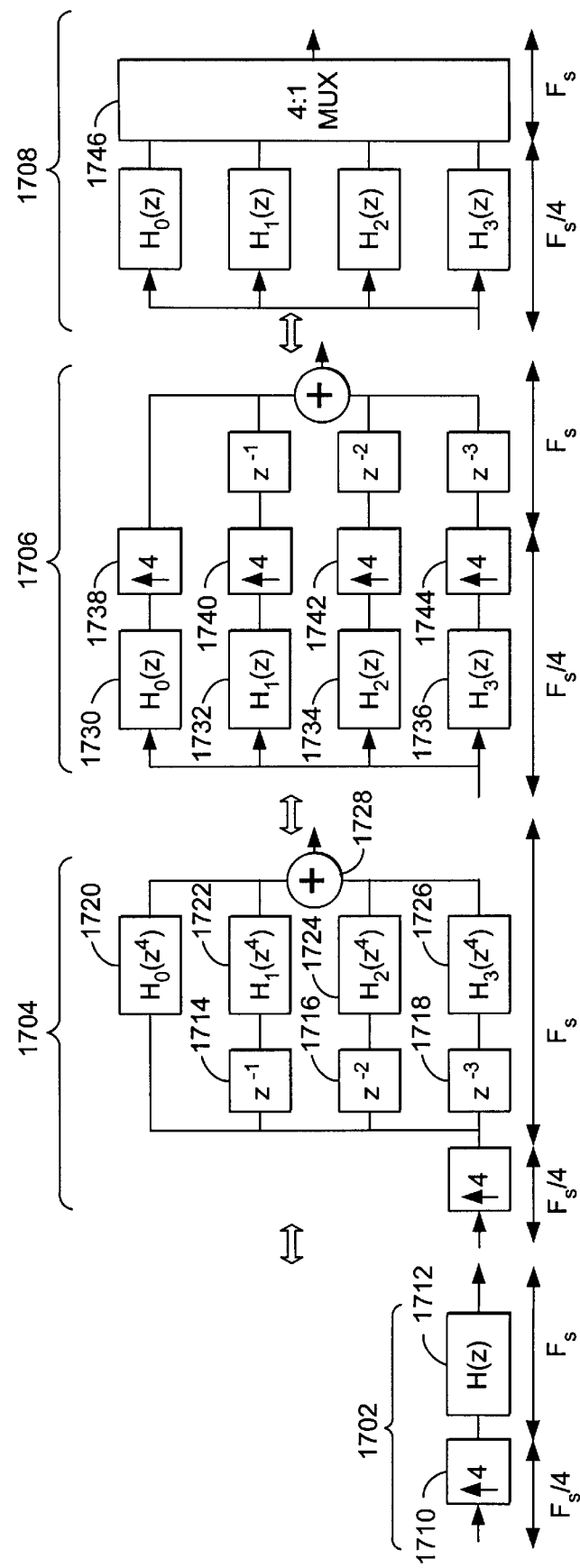
FIG. 17 is a polyphase implementation of an interpolate-by-four filter.

Since the algorithm does not treat zeros as zero, it is convenient to implement a filter that performs interpolation along with an expander in polyphase form because, in this form, the expander zeros are eliminated. FIG. 17 shows the transformation of an interpolate-by-four filter into polyphase form. Filter 1712 can be expanded into delay elements 1714, 1716, and 1718, branch filters 1720, 1722, 1724, and 1726, and an adder 1728. For example, for a 10-tap (N=10) FIR filter:

$$H(z) = \sum_{k=0}^{9} h_k z^{-k}$$

$$= h_0 + h_1 z^{-1} + h_2 z^{-2} + h_3 z^{-3} + h_4 z^{-4} + h_5 z^{-5} + h_6 z^{-6} + h_7 z^{-7} + h_8 z^{-8} + h_9 z^{-9}$$

$$= (h_0 + h_4 z^{-4} + h_8 z^{-8}) + z^{-1}(h_1 + h_5 z^{-4} + h_9 z^{-8}) + z^{-2}(h_2 + (h_2 + h_6 z^{-4}) + z^{-3}(h_3 + h_7 z^{-4})$$

$$H_0(Z^4) + z^{-1} H_1(Z^4)^{+z-2} H_2(Z^4)^{+z}{}_{-3}(z^4)$$

Figure 18:
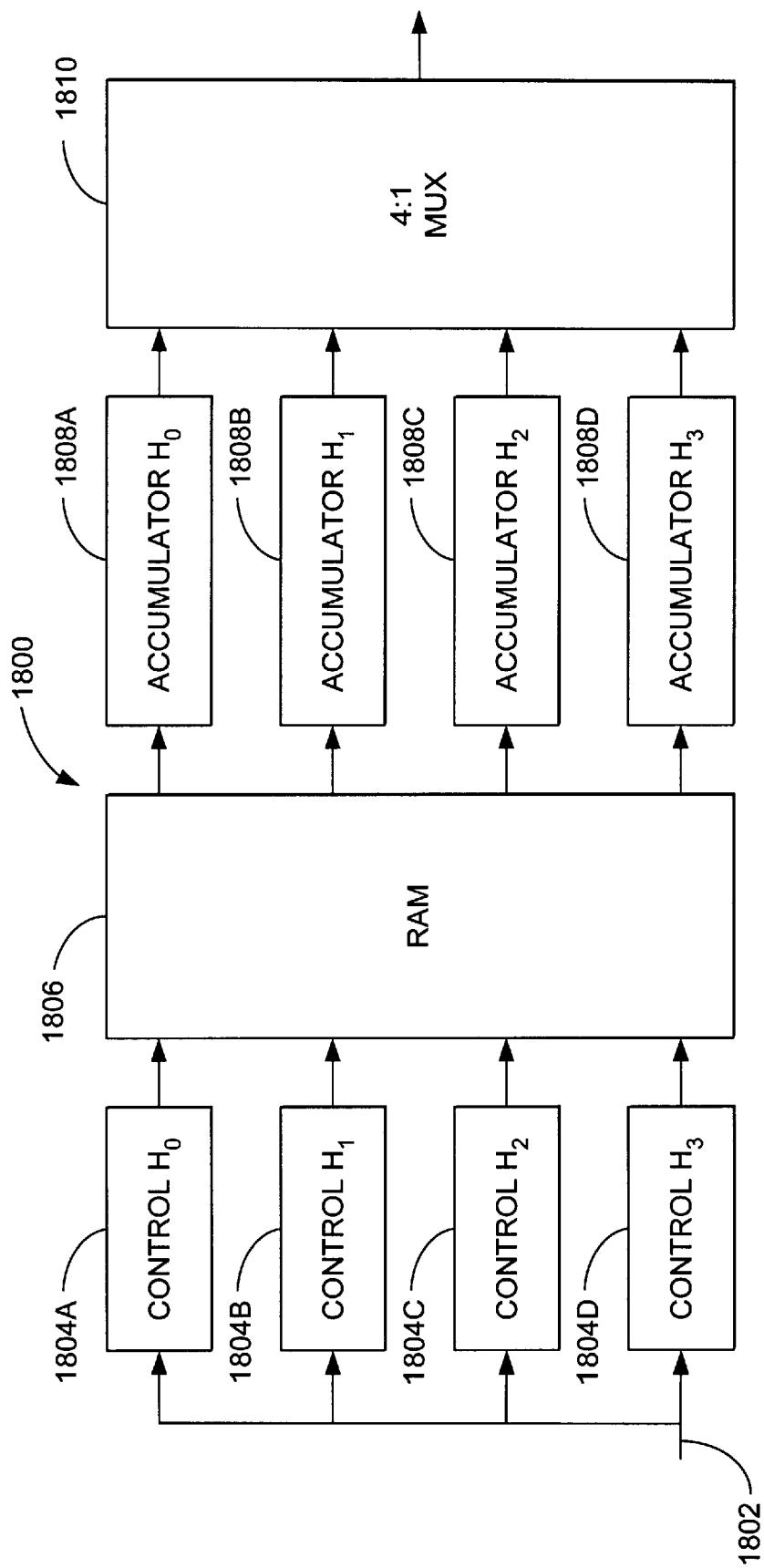
FIG. 18 is a block diagram showing an implementation of a low power, linear phase, interpolating-by-four pulse-shaping filter implemented in polyphase form using a random access memory (RAM)

Application of a noble identity (see, for example, P. P. Vaidyanathan, *Multirate Systems and Filter Banks* previously referenced) allows for the interchanging of the expander 1710 and filters 1720, 1722, 1724, and 1726 resulting in a filter structure 1706 in which the delay elements 1714, 1716, and 1718 have been moved through the new branch filters 1730, 1732, 1734, and 1736 and expanders 1738, 1740, 1742, and 1744. The four expanders 1738, 1740, 1742, and 1744, the delay elements 1714, 1716, and 1718, and the adder 1728 are logically equivalent to a 4:1 mux 1746. This change results in a filter structure 1708 consisting of branch filters 1730, 1732, 1734, and 1736 which operate only on the original input bits and not on any expander zeros and a 4:1 mux 1746. Label $F_s$ denotes the components operating at the higher sampling rate and label $F_s/4$ denotes the components operating at the lower (input bit) sampling rate. The FIR filters 1730, 1732, 1734, and 1736 can be implemented using a random access memory (RAM), control, and accumulator blocks as shown in FIG. 18. Control $H_k$ 1804A–1804D and accumulator Hk 1808A–1808D along with the RAM 1806 comprise FIR filter $H_k$ 1730, 1732, 1734, and 1736 in FIG. 17 where k=0, 1, 2, and 3. Each polyphase branch independently implements the algorithm so each accumulator 1808A–1808D may require different coefficients at the same time. For example, the accumulator in $H_0$ 1808A may need $h_0$ and $h_3$, the accumulator in $H_1$ 1808B may need $h_6$ and $h_7$, the accumulator in $H_2$ 1808C may need $h_8$, and the accumulator in $H_3$ 1808D may need $h_2$, $h_4$, and $h_5$. In order for the accumulators to run in parallel, a multi read-port RAM 1806 is required. Multi read-port RAMs 1806 consume more area, and the number of read-ports required quickly becomes impractical. For example, suppose we have an interpolating-by-four pulse-shaping filter implemented in polyphase form. A filter that implements QPSK requires a 4 read-port RAM, one that implements 16-QAM requires an 8 read-port RAM, and one that implements 64-QAM requires a 12 read-port RAM.

Figure 19:
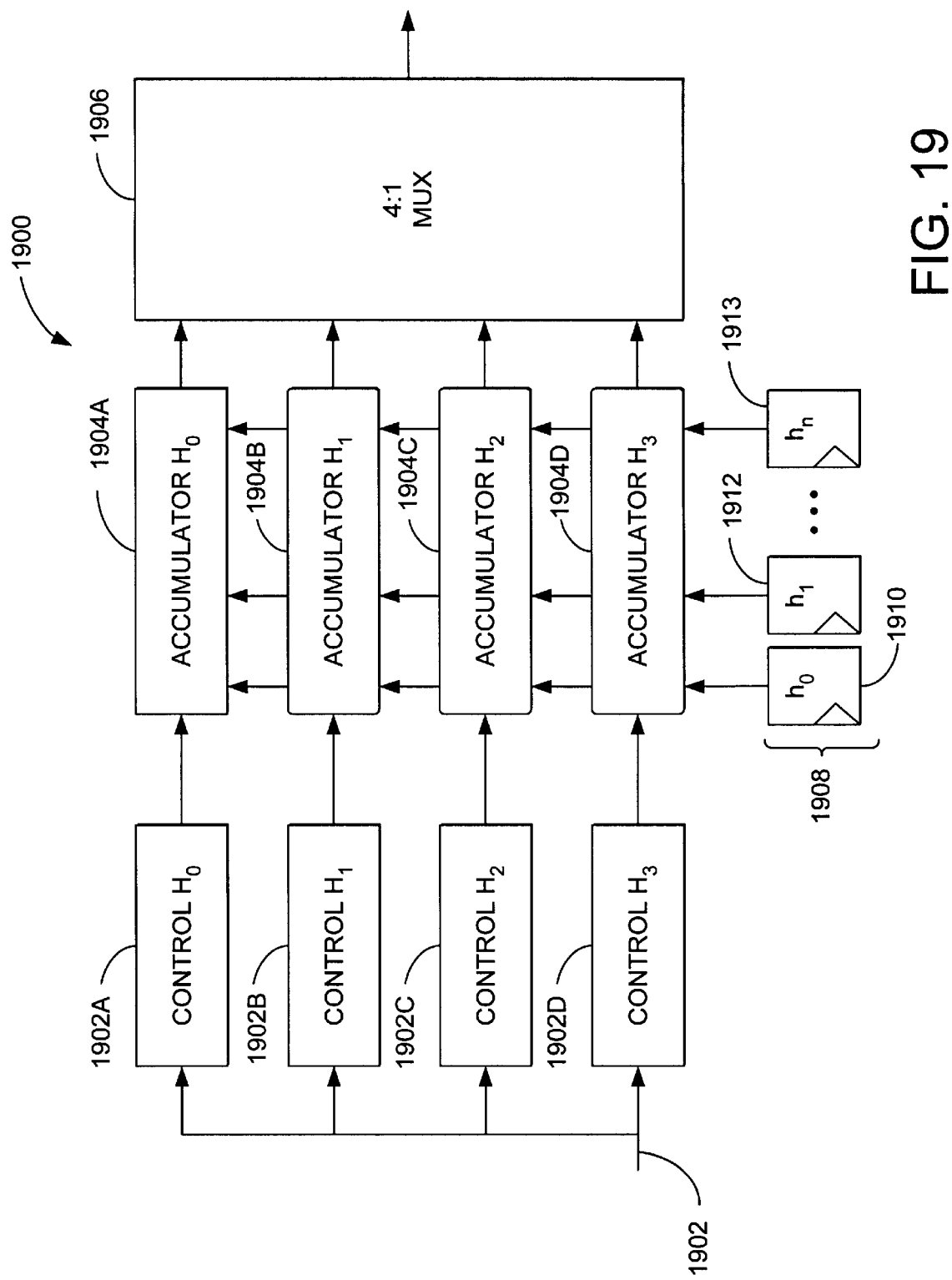
FIG. 19 is a block diagram showing an implementation of a low power, linear phase, interpolate-by-four pulse-shaping filter implemented in polyphase form using registers.

FIG. 19 is a block diagram showing an implementation of a low-power linear phase, interpolating by four pulse-shaping digital filter implemented in polyphase form using registers. This implementation does not require a multi-read port random access memory (RAM) and allows the storage of each coefficient once in one of the separate registers 1908 with the information routed to all of the sections. This effectively turns the RAM inside out, as the stored coefficients are simultaneously available to all of the summation elements without the need for generating an address for retrieval of the desired coefficient.

Another consequence of using an accumulator as the summation element is that a faster clock is required to do the additions before each new input arrives. However, a typical communication system has a faster clock in the system that can be appropriately divided down and used. Also, selective clock generation can reduce power. Clocks need only be generated for coefficients that are added instead of adding zero.

As previously described, only one of the two cases (ones or zeros) need be processed. That is, it is possible to just process the 1's or just process the 0's as the other case is obtained by negating the input, processing, and then negating the output. For example, consider 16-QAM with the input values listed in Table III below.

TABLE III

| Case | Input | Value |
|---|---|---|
| 1 | 00 | +¼ = 1/2 − ¼ |
| 2 | 01 | +¾ = ½+1 |
| 3 | 10 | −¾ = −½−1 |
| 4 | 11 | −¼ = −½+1 |

Only cases 1 and 2 need to be built in hardware or processed. Case 3 is obtained by negating the input, processing as case 2, and then negating the output. Similarly, case 4 is obtained by negating the input, processing as case 1, and then negating the output.

Certain QAM cases allow for an even further reduction of the number of additions. Consider 16-QAM with the input values listed in the table above. Note that the first input bit (MSB) represents ±½ while the second bit (LSB) represents ∓¼. The 16-QAM inputs of 00=½−¼=±¼ and 11=−½+−¼ can be implemented by just generating ±¼ whenever both inputs would cause additions in their respective sections. That is, whenever a bias value is not accounting for both of the input values just take ±¼. For example, consider a 10-tap filter with the following bit pairs at the 10 taps.

| $h_0$ | $h_1$ | $h_2$ | $h_3$ | $h_4$ | $h_5$ | $h_6$ | $h_7$ | $h_8$ | $h_9$ |
|---|---|---|---|---|---|---|---|---|---|
| 1 | 1 | 0 | 0 | 0 | 0 | 0 | 0 | 0 | 0 |
| 1 | 1 | 1 | 0 | 0 | 0 | 0 | 0 | 0 | 0 |

The algorithm states that the first row of bits will generate $$\frac{1}{2}\sum_i h_i - h_0 - h_1$$

and the second row will generate $$-\frac{1}{4}\sum_i h_i + \frac{1}{2}h_0 + \frac{1}{2}h_1 + \frac{1}{2}h_2.$$

Adding them together gives the desired result of $$\frac{1}{4}\sum_i h_i - \frac{1}{2}h_0 - \frac{1}{2}h_1 + \frac{1}{2}h_2.$$

However, taps $h_0$ and $h_1$, both have a 1 value, and both are not accounted for in the bias values. Therefore, the first row should generate $$\frac{1}{2}\sum_i h_i$$

and the second row $$-\frac{1}{4}\sum_i h_i - \frac{1}{2}h_0 - \frac{1}{2}h_1 + \frac{1}{2}h_2.$$

Adding them together gives the same result and saves two additions.

The algorithms can also be used to implement π/4 QPSK modulation using an approximation. Suppose the filter performs interpolation-by-four and is implemented in polyphase form. Two paths are used with weights of ⅝ and ¼. Every other tap on the ¼ path is killed in the following manner. First, only the 1st, 3rd, 5th, etc. taps are used in computing the output. Then, for the next output, only the 2nd, 4th, 6th, etc. taps are used. This effectively applies tap weights of ⅝ and ⅞=⅝+¼ to interleaved sequences of input bits. If all of the filter coefficients are scaled by 8/7 then the tap weights become 1 and 5/7 rather than 1 and $1/\sqrt{2}$. This amounts to a 1% error for the rotated constellation. The tap weights are easily implemented as ¼ is an arithmetic shift right by two bits and ⅝=½+⅛. Therefore, the algorithm can be implemented on both paths with the stated constraint on the killing of taps in the ¼ path.

The algorithm can be applied to sections of a filter or polyphase branch. This will reduce the complexity of the control hardware and potentially further reduce the number of additions, increase the speed of the filter, or reduce the area. For example, an 18-tap filter can be broken into two 9-tap sections. The algorithm can be independently applied to each section, and then, if required, the two partial sums can be added. However, if the circuitry following the filter can accommodate the partial sums, then one addition is saved. This may be the case if the following circuit uses carry-save arithmetic. The 18-tap filter has a maximum of nine additions while each 9-tap section has a maximum of four additions. If the 9-tap sections are run in parallel, then the speed of the filter may be doubled, and if a single 9-tap section is time-multiplexed, then area is saved.

A scrambler or randomizer in the transmitter can be employed to ensure a nearly equal mix of 1's and 0's. In such cases, this randomization means that the pulse-shaping filter in the transmitter will roughly see an even mix of 1's and 0's. Thus, the algorithm can expect to be working on an even mix of input data, and only one case may be implemented. No hardware is required to determine whether there are more 1's or 0's or to provide the appropriate bias value for each case. This greatly simplifies the hardware while still saving a significant amount of additions.

Embodiments Using Decimation Filters

Figure 20:
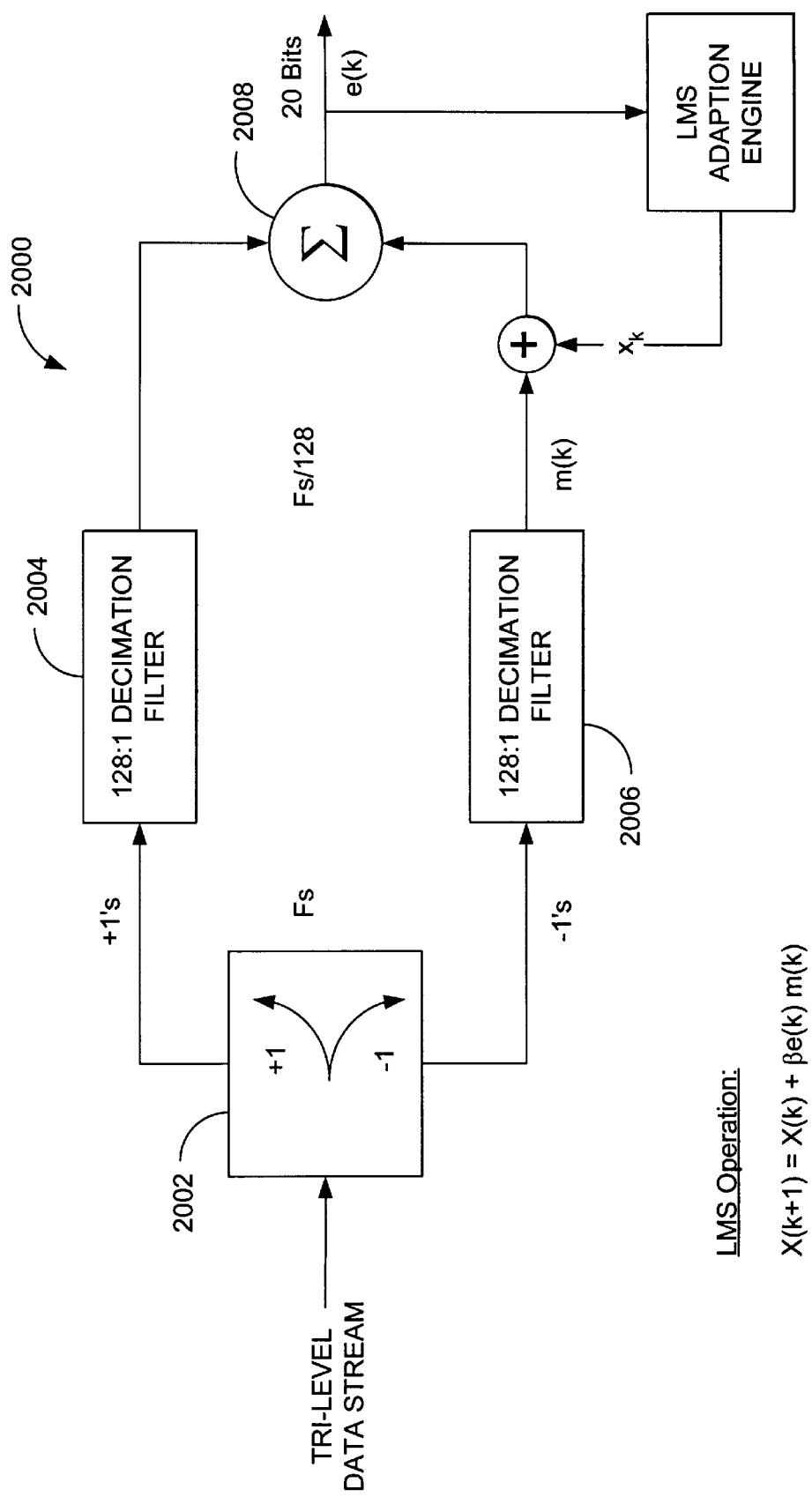
FIG. 20 is a block diagram of an alternative embodiment using an LMS filter/decimator chip.

FIG. 20 is a block diagram showing an alternative embodiment using a correcting least mean square (LMS) filter/decimator chip. Digital data entering the directing element 2002 of the digital filter 2000 is tri-level data (i.e. a stream of data samples, each being a member of the set $\{-1, 0, 1\}$). The positive one input values are directed to a first decimation filter 2004 and the negative one input values are directed to a second decimation filter 2006 by a directing element 2002. When a one is directed to the first decimation filter 2004 at a particular instant of time, a zero is created and sent simultaneously to the second decimation filter 2006. Similarly, a zero is sent to the first decimation filter 2004 whenever an incoming "−1" is directed to the second decimation filter 2006. Incoming zeros are routed to both the first decimation filter 2004 and the second decimation filter 2006. A further discussion of a filter such as that which is disclosed in FIG. 20 is presented in C. D. Thompson and S. R. Bemadas, "A Digitally-Corrected 20b Delta-Sigma Modulator," 1994 *IEEE International Solid State Circuits Conference*, pp. 194–195, Feb. 17, 1994, which is hereby incorporated by reference herein.

Although it is possible to arrange digital filters such as that which is disclosed in FIG. 20 so that an output data stream is produced at the same data rate as the input, such a configuration would be wasteful. As it is desired to decimate the outputs by a factor of N (in this instance, N=filter length=128), we only keep each $128^{th}$ sample of the output data streams. Therefore, we just wait until all N=128 input samples have been received, then compute the one desired output sample. We then bring in the next N=128 input samples. This process is repeated for subsequent input samples.

It is possible in principle that a total of N=128 non-zero bits might be received for the computation of some output sample pair (one output sample from the first decimation filter 2004 and one output sample from the second decimation filter 2006). For example, it is possible that no zero input values are received during some 128-bit input sequence. In such cases, the digital filter structure depicted in FIG. 20, would seem to require a total of up to N=128 addition operations to compute the outputs of both filters. (Here, whenever a zero bit is associated with a filter tap, there is no addition performed, unlike the digital filters previously described in the foregoing discussion in which zeros were processed as minus-ones.)

Further, if the input data was, in fact, evenly split between "+1" and "−1" samples, i.e. if we had 64 ones and 64 negative-ones and no input zeros, there would be 64 additions to perform for each filter, even when employing directly the gain modification and biasing techniques described herein. Thus, when considering each of the two filters as independent entities, it first appears that the gain modification and bias technique cannot be used to improve computational efficiency. However, as shown below, this is not the case, and both the first decimation filter 2004 and the second decimation filter 2006 outputs can be computed with no more than ⅔N additions. Moreover, if linear phase digital filters are employed, at most 5⁄12N additions are needed to compute the filter outputs for both the first decimation filter 2004 and the second decimation filter 2006.

This result is obtained by exploiting the fact that the first decimation filter 2004 and the second decimation filter 2006 are not in fact, independent, but are actually two copies of the same filter. That is, the tap-coefficients $\{h_0, h_1, \ldots, h_{127}\}$ are the same for both the first 2004 and second 2006 decimation filters. In addition to the zeros at the corresponding taps for both filters coming from input zero input values, there will be a zero at the first decimation filter's 2004 $k^{th}$ tap whenever the $k^{th}$ tap of the second decimation filter 2006 has a "−1" data value, and the $l^{th}$ tap of the second decimation filter 2006 has a zero whenever the first decimation filter's 2004 $l^{th}$ tap has "1".

When all of the N 128 input data samples have entered the digital filter 2000, each of the first/second decimation filter tap pairs can be considered as having one of the following three kinds of data vectors associated with it:

$$a = \begin{pmatrix} 1 \\ 0 \end{pmatrix}, b = \begin{pmatrix} 0 \\ 0 \end{pmatrix}, c = \begin{pmatrix} 0 \\ 1 \end{pmatrix}.$$

That is, tap k would be an a tap if the $k^{th}$ data bit for the first decimation filter 2004 is "1" and the $k^{th}$ data bit for the second decimation filter 2006 is "0," etc. Note that a "1" is used in c, rather than a "−1," because we can map the $\{0,-1\}$ input data sequence for the second decimation filter 2006 into a $\{0,1\}$ sequence, thereby requiring only addition of the appropriate $h_k$ tap weights to produce the filter's output, and a single subtraction could be performed instead of an addition at the summation junction 2008.

After the input data has entered both filters, we then classify the N=128 tap pairs into the three sets of tap pairs defined above: a, b, and c according to their data values. That is, tap-k∈c if the $k^{th}$ data bit pair is a c-tap (i.e. if the $k^{th}$ bit for the first decimation filter 2004 is a "0" and the $k^{th}$ bit for the second decimation filter 2006 is a "1" after being mapped from a "−1").

At least one of the three sets a, b, and c must have at most N/3=128⁄3=42 (rounding down) members. This is because sets a, b, and c cannot all have at least 43 members, since that would require 129 or more tap-pair members. Also, at least one of the three data sets a, b, and c must have at least N/3=128⁄3=43 (rounding up) members. This is because sets a, b, and c can not all have no more than 42 members each, because that would total only 126 or less tap-pairs.

Consider the Largest of the Three Sets a, b, and c:

Case 1: If the largest set is set b, then normal processing is performed. That is, the $h_k$ tap coefficient values are added for k∈a to obtain the first decimation filter's 2004 output, and the $h_k$ tap coefficient values for taps k∈c are added to get the second decimation filter's 2006 output. This requires at most a total of 128−43=85 additions. Note that this is equivalent to ⅔N additions (85=⅔ 128=⅔N). In this case, we are processing the non-zero bit taps and we are using a bias of zero for both filters.

Case 2: If set a is the largest of the three sets, then we process the taps corresponding to sets b and c. For the second decimation filter 2006, the additions of the $h_k$ tap coefficient values for the taps k∈c are performed. That is, the second decimation filter 2006 processes the non-zero bit taps with a bias of zero.

The output of the first decimation filter 2004 is the sum of all tap-coefficient values minus $\Sigma_b$ and $\Sigma_c$, where $\Sigma_b$ denotes the sum of all tap-coefficient values $h_k$ for k∈b and $\Sigma_c$ denotes the sum of all tap coefficient values $h_k$ for k ∈ c. We are now just computing the output of the first decimation filter 2004 by processing its zeros with a bias of $-\Sigma h_k$. That is, the output of the first decimation filter 2004 is $-(-\Sigma h_k + \Sigma_b + \Sigma_c)$ where the term $-\Sigma h_k$ is the bias, and the output of the second decimation filter is $0+\Sigma_c$ where 0 is the bias. As can be seen from the foregoing, $\Sigma_c$ need only be computed once, and can be used in both the first decimation filter 2004 and in the second decimation filter 2006. Note also that only add operations are being performed in the accumulators, and that no subtract operations are performed. As was the case in Case 1, the total computation required for obtaining both filter outputs is at most ⅔N additions.

Case 3: If set c is the largest, we proceed as in Case 2, using similar computations. The output of the first decimation filter 2004 is then $0+\Sigma_a$ and the output of the second decimation filter 2006 is $-(-\Sigma h_k + \Sigma_a + \Sigma_b)$. In summary, in all cases, we can avoid processing the tap-pairs of whichever set has the most elements (>⅓N). That is, in the exemplary case of a 128-bit tap filter pair, we save ⅓ 128=43 add operations or more (depending on the input data). Note, as in other embodiments, rounding (e.g. 42⅔⇒43) works in our favor.

Next, consider the case where the first decimation filter 2004 and the second decimation filter 2006 are linear phase filters. Consider explicitly the case where N is an even number and there is even coefficient symmetry. Other linear phase filters can be accomplished similarly. As before, we pair-up taps having equal values in each filter. Now, for each quad of filter taps (i.e. pair of taps in the first decimation filter 2004 and the corresponding pair of taps in the second decimation filter 2006, all four of which having the same $h_k$ filter-tap coefficient value) we can define six types of associated data matrices:

$$a = \begin{pmatrix} 1 & 1 \\ 0 & 0 \end{pmatrix};$$

$$b = \begin{pmatrix} 1 & 0 \\ 0 & 0 \end{pmatrix} \text{ or } \begin{pmatrix} 0 & 1 \\ 0 & 0 \end{pmatrix};$$

$$c = \begin{pmatrix} 1 & 0 \\ 0 & 1 \end{pmatrix} \text{ or } \begin{pmatrix} 0 & 1 \\ 1 & 0 \end{pmatrix};$$

$$d = \begin{pmatrix} 0 & 0 \\ 0 & 0 \end{pmatrix};$$

$$e = \begin{pmatrix} 0 & 0 \\ 1 & 0 \end{pmatrix} \text{ or } \begin{pmatrix} 0 & 0 \\ 0 & 1 \end{pmatrix};$$

$$f = \begin{pmatrix} 0 & 0 \\ 1 & 1 \end{pmatrix}.$$

In the computation of the filter outputs, in a manner similar to that employed in a single linear phase filter, the following result is obtained. For the type a data matrix above, we add $2h_k$ to the first decimation filter 2004 output and add nothing to the second decimation filter 2006 output. For the type b data matrix above, we add $h_k$ to the first decimation filter 2004 output and add nothing to the second decimation filter 2006. For the type c data matrix above, we add $h_k$ to both the top and bottom filter outputs. The foregoing is repeated for the type d–f data matrices.

After the input data has entered both filters, let the N/2 tap quads be classified into the six sets of tap-quads (a, b, c, d, e, and f) described above in a way that generalizes the previous discussion (i.e. tap-quad $h_k$∈a if it is associated with data matrix of type a, etc.). At least one of these sets must have at least N/6 members. As in the previously discussed case of computing outputs of a single linear-phase filter, we can omit the consideration of the tap-coefficients corresponding to this largest tap-quad set, and we can obtain the outputs of both filters using $\Sigma_a, \Sigma_b, \ldots, \Sigma_f$ and appropriate bias values. Now, we have, at most, a total of ⅚ of the N/2 tap-quad values to be added, employing an appropriate bias value in each addition. That is, we require a total of ⅚•N/2 =5/12N additions for both filter outputs.

Infinite Impulse Response Filters

Figure 21:
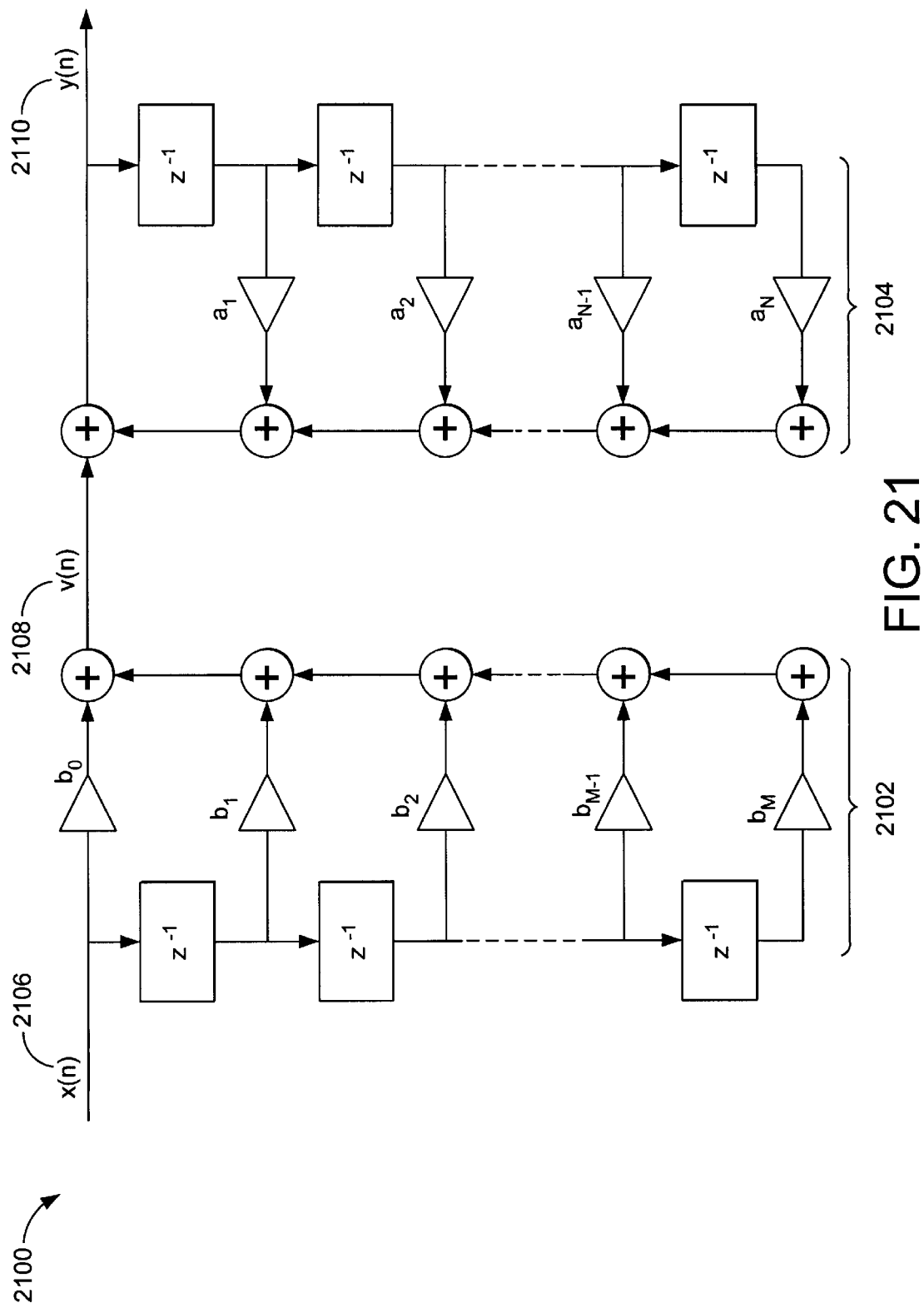
FIG. 21 is a block diagram of a direct form I realization of a difference equation describing an infinite impulse response digital filter.
Figure 22:
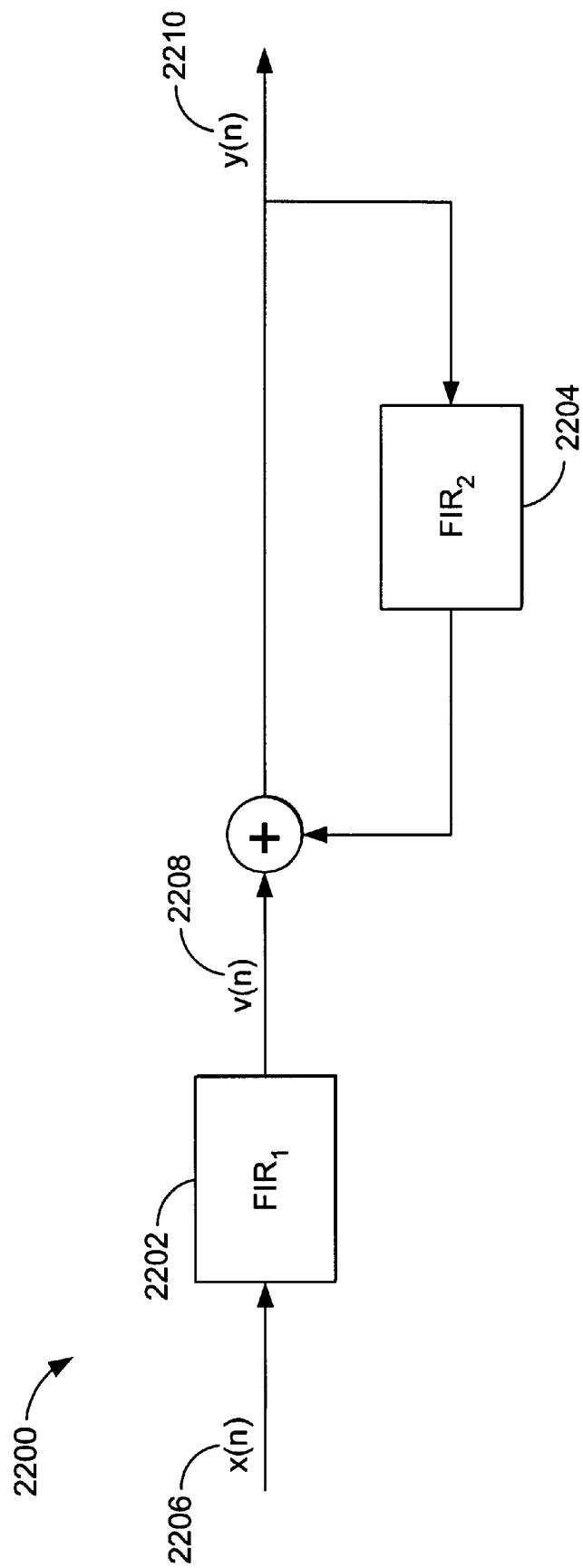
FIG. 22 is a block diagram showing an infinite impulse response digital filter realized by two finite impulse response filters.

Any infinite impulse response (IIR) digital filter, which can be described by the difference equation $$y(n) = \sum_{k=1}^{N} a_k y(n-k) + \sum_{k=0}^{M} b_k x(n-k),$$

can be realized in the direct form I structure shown in FIG. 21 (see, for example, J. G. Proakis and D. G. Manolakis, *Digital Signal Processing Principles, Algorithms, and Applications*, New York, N.Y., Macmillan, 1992, which is hereby incorporated by reference herein). IIR filter 2100, comprising two sections 2102 and 2104, can also be realized using two FIR filters 2202 and 2204 as shown in FIG. 22. The FIR filters 2202 and 2204 realize the functions of sections 2102 and 2104, respectively. The two FIR filters 2202 and 2204 can be implemented using any of the methods previously described. Therefore, IIR filters can also benefit from the low-power digital filtering methods described herein.

Additional Alternative Embodiments

As can be readily seen by the foregoing, the technique taught by the present invention (mapping the input data stream, selectively modifying the digital filter tap weight values, and applying a bias to compensate for the modified digital filter tap weight values) can be readily applied in a wide variety of digital filters.

We have also disclosed that the input values $\{x_0, x_1, \ldots, x_{N-1}\}$ can be advantageously mapped to different values to create a pattern of zeros and non-zero factors at each of the tap-weights to reduce the number of computations required to produce the digital filter output. For example, a digital filter designed to reduce computations by a certain factor for a particular majority input-bit type can be used to reduce computations for a different majority input bit type, by suitable mapping of the input data stream. Simple examples have been presented in which the factors $A_0=A_1=\ldots=A_{N-1}=2$, and other examples have been presented in which different combinations of factors $\{A_0, A_1, \ldots, A_{N-1}\}$, input data stream mapping, and biasing can be applied to reduce the number of computations or increase the implementation efficiency of the digital filter.

Generally described, the method employed includes the steps of successively delaying each of a series of mapped input values to create tap values $\{t_0,t_1,\ldots,t_{N-1}\}$, multiplying each of the tap values by weight values $\{h_0,h_1,\ldots,h_{N-1}\}$ selected to achieve a desired filter response and by factors $\{A_0,A_1,\ldots,A_{N}\text{-}1\}$ selected to reduce the number of operations performed in filtering the input data stream to produce $\{A_0t_0h_{0,A1}t_1h_1,\ldots,A_{N-1}t_{N-1}h_{N-1}\}$. The resulting values $\{A_0t_0h_{0,A1}t_1h_1,\ldots,A_{N-1}t_{N-1}h_{N-1}\}$ are combined to produce $$\sum_{k=0}^{N-1} A_k t_k h_k,$$

and the result is biased by an appropriate value to compensate for the applied factors $\{A_0,A_1,\ldots,A_{N}\text{-}1\}$.

Using the foregoing teaching, j tap value subsets can be defined, each of these subsets associated with an accompanying factor and weight value $A_j$ to reduce the number of computations. For example, the tap values can be broken into two subsets comprising a first subset $\{t_0,t_1,\ldots,t_{N/2}\}$ associated with a factor A, and a second subset $\{t_{N/2+1},\ldots,t_{N-1}\}$ associated with a factor $A_2$. With suitable biasing and mapping of the input data stream, the desired digital filter response can be achieved, while minimizing the number of computations performed, increasing computation speed, and/or reducing circuit complexity of the digital filter.

Conclusion

This concludes the description of the preferred embodiments of the present invention. In summary, the present invention describes a method, apparatus, and article of manufacture for implementing a low-power finite impulse response digital filter.

The method comprises the steps of successively delaying and mapping each of the input values $\{x_0,x_1,\ldots,x_{N-1}\}$ to create tap values $\{t_0,t_1,\ldots,t_{N-1}\}$, multiplying each of the tap values $\{t_0,t_1,\ldots,t_{N-1}\}$ by $A\bullet\{h_0,h_1,\ldots,h_{N-1}\}$ to produce $\{At_0h_0,At_1h_1,\ldots,At_{N-1}h_{N-1}\}$ wherein values $\{h_0,h_1,\ldots,h_{N-1}\}$ are weight values selected to achieve a desired filter response and A is a factor selected to reduce the number of operations performed in filtering the input data stream, summing the values $\{At_0h_0,At_1h_1,\ldots,At_{N-1}h_{N-1}\}$ to produce $$\sum_{k=0}^{N-1} At_k h_k,$$

biasing the summed values $\{At_0h_0,At_1h_1,\ldots,At_{N-1}h_{N-1}\}$ to compensate for the multiplied tap values and to produce a digital filter output. The article of manufacture comprises means for performing the above method steps.

The apparatus comprises an interconnected series of k stages wherein $k=\{1,2,\ldots,N-1\}$. Each of the stages comprises a delay element $z_k^{-1}$ having a delay element input and a delay element output, a weighting element having a weighting element input and a weighting element output, wherein a gain of the weighting element is selected to be a product of a gain $h_k$ required to achieve a desired digital filter response, and a factor A selected to reduce digital filter operations, and a summation element having a first summation element input, a second summation element input, and a summation element output. The apparatus further comprises a leading gain element with a gain of $h_0$ required to achieve a desired digital filter frequency response and a factor A selected to improve computational and hardware efficiency. The leading gain element has a leading gain element input coupled to a first stage delay element input and a leading gain element output coupled to a first stage first summation element input. The delay element output of each stage is coupled to the gain element input of the stage and the gain element output of each stage is coupled to the second summation element input of the stage. The delay element output of each stage except the last is coupled to the delay element input of a following stage and the summation element output of each stage except the last is coupled to the first summation element input of the following stage. The summation element output of the last stage provides the digital filter output, while the digital filter's input is connected to the delay element input of the first stage. A bias summation element modifies the above-described structure by coupling between the leading gain element output and the first stage summation element first summation element input, another summation element at which is added in a bias to compensate for the modified weighting element outputs.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A finite impulse response digital filter for filtering input values, comprising:

an interconnected series of k stages wherein $k=1,2,\ldots,N-1$, each stage having:

a delay element $z^{-1}{}_k$ having a delay element input and a delay element output;

a weighting element having a weighting element input and a weighting element output, wherein a gain of the weighting element is selected to be a product of a gain $h_k$ required to achieve a desired digital filter response and a factor A selected to improve digital filter computational efficiency; and a summation element having a first summation element input, a second summation element input, and a summation element output; and a leading gain element with a gain of $Ah_0$, wherein $h_0$ is a gain selected to achieve a desired digital filter response, and the leading gain element includes a leading gain element input coupled to a first stage delay element input and a leading gain element output coupled to a first stage first summation element input;

wherein the delay element output of each stage is coupled to the gain element input of the stage and the gain element output of each stage is coupled to the second summation element input of the stage;

wherein the delay element output of each stage except a last stage is coupled to the delay element input of a following stage and the summation element output of each stage except the last stage is coupled to the first summation element input of the following stage; and a bias summation element coupled between the leading gain element and the first stage first summation element.

2. The finite impulse response digital filter of claim 1, wherein the bias is such as to compensate for the modified delayed, mapped, and weighted input values.

3. The finite impulse response digital filter of claim 1, wherein the factor A is two and the bias is selected from the group comprising $$-\sum_{0}^{N-1} h_k \text{ and } \sum_{0}^{N-1} h_k.$$

4. The finite impulse response digital filter of claim 1, further comprising:
a means for determining whether a majority of the input values are a zero input value or a non-zero input value;
means for setting the bias to a value proportional to $$-\sum_{0}^{N-1} h_k$$

when the majority of the input values is a zero input value; and
means for setting the bias to a value proportional to $$\sum_{0}^{N-1} h_k$$

when the majority of the input values is a non-zero input value.

5. The finite impulse response digital filter of claim 1, wherein the means for determining whether a majority of input values are a zero input value or a non-zero input value comprises:
an accumulator; and
a logical circuit for selectively incrementing and decrementing the accumulator according to the input value and the last delayed input value.

6. The finite impulse response digital filter of claim 5, wherein the accumulator comprises a counter.

7. The finite impulse response digital filter of claim 5, wherein the accumulator comprises a pointer.

8. A method of filtering a series of mapped input data values $\{x_0, x_1, \ldots, x_{N-1}\}$, comprising the steps of:
(a) successively delaying, in a digital processor, each of the mapped input values to create tap values $\{t_0, t_1, \ldots, t_{N-1}\}$;
(b) multiplying, in the digital processor, each of the tap values $\{t_0, t_1, \ldots, t_{N-1}\}$ by $A \cdot \{h_0, h_1, \ldots, h_{N-1}\}$, to produce $\{At_0 h_0, At_1 h_1, \ldots, At_{N-1} h_{N-1}\}$ wherein values $\{h_0, h_1, \ldots, h_{N-1}\}$ are weight values selected to achieve the desired filter response and A is a factor selected to improve computational efficiency in filtering the input data values;
(c) summing, in the digital processor, the values $\{At_0 h_0, At_1 h_1, \ldots, At_{N-1} h_{N-1}\}$ to produce $$\sum_{k=0}^{N-1} At_k h_k;$$

and
(d) biasing, in the digital processor, the summed values $\{At_0 h_0, At_1 h_1, \ldots, At_{N-1} h_{N-1}\}$ to compensate for the factored weight values $\{At_0 h_0, At_1 h_1, \ldots, At_{N-1} h_{N-1}\}$ to produce the filtered series of mapped input data values.

9. The method of claim 8, wherein the weight values $\{h_0, h_1, \ldots, h_{N-1}\}$ are symmetrically definable as $\{a, b, c, \ldots, c, b, a\}$.

10. The method of claim 8, wherein steps (b) and (c) are performed only for a subset of all tap values, the subset being input data dependent.

11. The method of claim 10, wherein steps (b) and (c) are performed only for tap values $\{t_0, t_1, \ldots, t_{N-1}\}$ which are non-zero.

12. The method of claim 8, wherein A=2 and the bias applied to the sum of the values $$\{At_0 h_0, At_1 h_1, \ldots, At_{N-1} h_{N-1}\} \text{ is } -\sum_{0}^{N-1} h_k.$$

13. The method of claim 8, wherein the step of biasing the summed values $\{At_0 h_0, At_1 h_1, \ldots, At_{N-1} h_{N-1}\}$ to produce the filtered series of mapped input data values comprises the steps of:
determining whether a majority of the mapped input data values are a zero input value or a non-zero input value;
computing the filtered series of mapped input data values as $$\sum_{k=0}^{N-1} At_k h_k - \sum_{k=0}^{N-1} h_k$$

when the majority of the mapped input values are the zero input value; and
computing the filtered series of mapped input data values as $$\sum_{k=0}^{N-1} At_k h_k + \sum_{k=0}^{N-1} h_k$$

when the majority of the mapped input values are the non-zero input value.

14. The method of claim 13, wherein the step of determining whether a majority of the mapped input values are a non-zero input value or a zero input value comprises the steps of:
initializing an accumulator; and
selectively incrementing the accumulator according to the input value and the last delayed input value.

15. A method of processing a series of input values to produce a series of output values having a desired output characteristic by implementing a sum of a series of delayed, mapped, and weighted input values, comprising the steps of:
modifying, in a digital processor, the weight of the delayed, mapped, and weighted input values; and
biasing, in the digital processor, the sum of the series of delayed mapped, and weighted input values to produce the series of output values having the desired output characteristic.

16. The method of claim 15, further comprising the step of summing, in the digital processor, only the delayed, mapped, and weighted input values corresponding to a non-zero mapped input value.

17. The method of claim 15, wherein the weight of each of the delayed, mapped, and weighted input values is multiplied by a single weighting factor.

18. The method of claim 15, wherein the sum of the series of delayed, mapped and weighted input values is biased to compensate for the modified, delayed, mapped, and weighted input values.

19. The method of claim 17, wherein the weighting factor is two, and the step of biasing the sum of the series of delayed, mapped and weighted input values comprises the step of biasing by the sum of the series of delayed, mapped and weighted input values by a value proportional to the sum of the weights applied to each of the series of delayed mapped input values.

20. The method of claim 15, wherein the step of biasing the sum of the series of delayed, mapped, and weighted input values comprises the steps of:
  determining whether a majority of the input values are a zero input value or a non-zero input value;
  when a majority of the input values are the zero input value, subtracting the sum of the weights applied to each of the series of delayed mapped input values from the sum of the series of delayed, mapped, and weighted input values and summing only the delayed, mapped, and weighted input values corresponding to a non-zero input value; and
  when a majority of the input values are a non-zero input value, adding the sum of the weights applied to each of the series of delayed mapped input values to the sum of the series of delayed, mapped, and weighted input values, and summing only the delayed, mapped, and weighted input values corresponding to a zero input value.

21. The method of claim 20, wherein the step of determining whether a majority of the mapped input values are a non-zero input value or a zero input value comprises the steps of:
  initializing an accumulator; and
  selectively incrementing and decrementing the accumulator according to the input value and a last delayed input value.

22. The method of claim 21, wherein the step of selectively incrementing and decrementing the accumulator according to the input value and the last delayed input value comprises the step of incrementing the accumulator in an input value direction when the input value and the last delayed input value are different.

23. The method of claim 21, wherein the step of selectively incrementing and decrementing the accumulator according to the input value and the last delayed input value comprises the steps of:
  decrementing the accumulator when the input value corresponds to a zero input value and the last delayed input value corresponds to a one input value; and
  incrementing the accumulator when the input value corresponds to a non-zero input value and the last delayed input value corresponds to a zero input value.

24. An apparatus for computing the response of a digital filter by implementing a sum of a series of delayed, mapped, and weighted input values, comprising:
  means for modifying the weight of the delayed, mapped, and weighted input values; and
  means for biasing the sum of the series of delayed, mapped, and weighted input values.

25. The apparatus of claim 24, further comprising means for summing only the delayed, mapped, and weighted input values corresponding to a non-zero input value.

26. The apparatus of claim 24, wherein the weight of each of the delayed, mapped, and weighted input values is multiplied by a single weighting factor.

27. The apparatus of claim 26, wherein the weighting factor is two, and the means for biasing the sum of the series of delayed, mapped, and weighted input values comprises means for biasing the sum of the series of delayed, mapped, and weighted input values by a value proportional to the sum of the weights applied to each of the series of delayed mapped input values.

28. The apparatus of claim 24, wherein the means for biasing the sum of the series of delayed, mapped, and weighted input values comprises:
  means for determining whether a majority of the input values are a zero input value or a non-zero input value;
  means for subtracting the sum of the weights applied to each of the series of delayed mapped input values from the sum of the series of delayed, mapped, and weighted input values and summing only the delayed, mapped, and weighted input values corresponding to a non-zero input value when a majority of the input values are the zero input value; and
  means for adding the sum of the weights applied to each of the series of delayed mapped input values to the sum of the series of delayed, mapped, and weighted input values, and summing only the delayed, mapped, and weighted input values corresponding to a zero input value when a majority of the input values are a non-zero input value.

29. The apparatus of claim 28, wherein the means for determining whether a majority of the mapped input values are a non-zero input value or a zero input value comprises:
  means for initializing an accumulator; and
  means for selectively incrementing and decrementing the accumulator according to the input value and a last delayed input value.

30. The apparatus of claim 29, wherein the means for selectively incrementing and decrementing the accumulator according to the input value and the last delayed input value comprises means for incrementing the accumulator in an input value direction when the input value and the last delayed input value are different.

31. The apparatus of claim 29, wherein the means for selectively incrementing and decrementing the accumulator according to the input value and the last delayed input value comprises:
  means for decrementing the accumulator when the input value corresponds to a zero input value and the last delayed input value corresponds to a one input value; and
  means for incrementing the accumulator when the input value corresponds to a non-zero input value and the last delayed input value corresponds to a zero input value.

32. The apparatus of claim 24, wherein the sum of the series of delayed, mapped, and weighted input values is biased in an amount required to compensate for the modified, delayed, mapped, and weighted input values.

33. A program storage device, readable by a computer, tangibly embodying one or more programs of instructions executable by the computer to perform method steps of filtering an input data stream $\{x_0, x_1, \ldots, x_{N-1}\}$, the method steps comprising the steps of:
  (a) successively delaying and mapping each of the input values to create tap values $\{t_0, t_1, \ldots, t_{N-1}\}$;
  (b) multiplying each of the tap values $\{t_0, t_1, \ldots, t_{N-1}\}$ by $A \cdot \{h_0, h_1, \ldots, h_{N-1}\}$, to produce $\{At_0 h_0, At_1 h_1, \ldots, At_{N-1} h_{N-1}\}$ wherein values $\{h_0, h_1, \ldots, h_{N-1}\}$ are weight values selected to achieve a desired filter response and A is a factor selected to improve computational efficiency in filtering the input data stream;

(c) summing the values $\{At_0h_0, At_1h_1, \ldots, At_{N-1}h_{N-1}\}$ to produce $$\sum_{k=0}^{N-1} At_k h_k;$$

and (d) biasing the sum $$\sum_{k=0}^{N-1} At_k h_k$$

to compensate for the factored weight values to produce a digital filter output.

34. A method of filtering a series of mapped input data values $\{x_0, x_1, \ldots, X_{N-1}\}$, comprising the steps of:

(a) successively delaying, in a digital processor, each of the input values to create tap values $\{t_0, t_1, t_2 \ldots, t_{N-3}, t_{N-2}, t_{N-1}\}$ associated with tap weights $\{h_0, h_1, h_2 \ldots, h_{N-3}, h_{N-2}h_{N-1}\}$, wherein the tap weights comprise one or more tap weight pairs $\{h_{i-1}, h_{N-i}\}$ defined according to a relationship selected from the group comprising $h_{i-1}=h_{N-i}$ and $h_{i-1}=-h_{N-i}$ for i=1,2, 3, . . . ,N/2 when N is even and i=1,2,3, . . . , (N+1)/2 when N is odd, and wherein each tap weight pair $\{h_{i-1}, h_{N-i}\}$ is associated with a tap value pair $\{t_{i-1}, t_{N-i}\}$;

(b) determining, in the digital processor, a state for each tap value pair $\{t_{i-1}, t_{N-i}\}$;

(c) selectively multiplying, in the digital processor each of the tap values by tap weights modified according to the tap weight pair state;

(d) summing, in the digital processor, the selectively multiplied tap values;

(e) determining, in the digital processor, a tap weight pair majority case;

(f) biasing, in the digital processor, the summed values in accordance with the tap weight pair majority case to produce the filtered series of input values.

35. The method of claim 34, wherein:

the state is selected from the group comprising a first state, a second state, and a third state, wherein the first state is selected for $\{t_{i-1}, t_{N-i}\}$, when $\{t_{i-1}=t_{N-i}=0\}$;

the second state is selected for $\{t_{i-1}, t_{N-i}\}$, when $\{t_{i-1}=t_{N-i}=1\}$; and the third state is selected for $\{t_{i-1}, t_{N-i}\}$, when $\{t_{i-1} \neq t_{N-i}\}$;

the tap weight pair majority case is selected from the group comprising a first case, a second case, and a third case, wherein the first case is selected when at least one third of the tap-weight pairs belong to the first state;

the second case is selected when at least one third of the tap-weight pairs belong to the second state; and the third case is selected when at least one third of the tap-weight pairs belong to the third state;

the summed values are unbiased, and the tap weights of each tap weight pair $\{h_{i-1}, h_{N-1}\}$ are modified to be $2h_k$ for tap weight pairs of the second state and $-2h_k$ for tap weight pairs of the first state when the tap weight pair majority case is the third case;

the summed values are biased by $$2\sum_{k=0}^{N-1} h_k,$$

and the tap weights of each tap weight pair $\{h_{i-1}, h_{N-i}\}$ are modified to be $-2h_k$ for tap weight pairs of the third state and $-4h_k$ for tap weight pairs of the first state when the tap weight pair majority case is the second case; and the summed values are biased by $$-2\sum_{k=0}^{N-1} h_k,$$

and the tap weights of each tap weight pair $\{h_{i-1}, h_{N-i}\}$ are modified to be $2h_k$ for tap weight pairs of the third state and $4h_k$ for tap weight pairs of the second state when the tap weight pair majority case is the first case.

36. A method of reducing the computations required in a digital filter implementing a sum of a series of weighted and delayed input data values, comprising the steps of:

computing the sum of a series of weighted and delayed input data values, with data value weights definable by $A_{[k] \cdot \{h0\}}, h_1, \ldots, h_{N-1}\}$ wherein values $\{h_0, h_1, \ldots, h_{N-1}\}$ are weight values selected to achieve a desired filter response, and $A_{[k]}$ is selected to improve computational efficiency in filtering the input data stream; and biasing at least one of the weighted and delayed input data values to compensate for the data value weights.

37. A method of filtering a series of mapped input data values $\{x_0, x_1, \ldots, x_{N-1}\}$, comprising the steps of:

(a) successively delaying, in a digital processor, each of the mapped input values to create tap values $\{t_0, t_1, \ldots, t_{N-1}\}$;

(b) multiplying, in the digital processor, each of the tap values $\{t_0, t_1, \ldots, t_{N-1}\}$ by values $\{h_0, h_1, \ldots, h_{N-1}\}$ and factors $\{A_0, A_1, \ldots, A_{N-1}\}$ to produce $\{A_0t_0h_0, A_1t_1h_1, \ldots, A_{N-1}t_{N-1}h_{N-1}\}$ wherein values $\{h_0, h_1, \ldots, h_{N-1}\}$ are weight values selected to achieve a desired filter response and $\{A_0, A_1, \ldots, A_{N-1}\}$ are factors selected to improve computational efficiency in filtering the input data stream;

(c) summing, in the digital processor, the values $\{A_0t_0h_0, A_1t_1h_1, \ldots, A_{N-1}t_{N-1}h_{N-1}\}$ to produce $$\sum_{k=0}^{N-1} A_k t_k h_k;$$

and (d) biasing, in the digital processor, the summed values $$\sum_{k=0}^{N-1} A_k t_k h_k$$

to produce a digital filter output having the filtered series of mapped input data values.

38. A method of filtering a series of mapped input data values $\{x_0, x_1, \ldots, x_{N-1}\}$ comprising the steps of:

(a) successively delaying, in a digital processor, each of the input values to create a set of tap values $\{t_0, t_1, \ldots, t_{N-1}\}$;

(b) multiplying, in the digital processor, each member of the $j^{th}$ subset, for j=1,2, . . . ,p of the set of tap values $\{t_0,t_1, \ldots ,t_{N-1}\}$ by corresponding members of corresponding subsets of the set $A_j \cdot \{h_0,h_1, \ldots ,h_{N-1}\}$ to produce subsets of the set $\{A_j t_0 h_0, A_j t_1 h_1, \ldots ,A_j t_{N-1} h_{N-1}\}$ wherein values $\{h_0,h_1, \ldots ,h_{N-1}\}$ are weight values selected to achieve a desired filter response, and $A_j$ is a factor selected to improve computational efficiency of the digital filter;

(c) summing, in the digital processor, the values of the members of the p subsets; and (d) biasing, in the digital processor, the sum of the values of the members of the p subsets to produce a digital filter output having the filtered series of mapped input data values.

39. An apparatus for filtering a series of mapped input data values $\{x_0,x_1, \ldots ,x_{N-1}\}$, comprising:

(a) means for successively delaying each of the mapped input values $\{x_0,x_1, \ldots ,x_{N-1}\}$ to create tap values $\{t_0,t_1, \ldots ,t_{N-1}\}$;

(b) means for multiplying each of the tap values $\{t_0, t_1, \ldots ,t_{N-1}\}$ by values $\{h_0,h_1, \ldots ,h_{N-1}\}$ and factors $\{A_0,A_1, \ldots ,A_{N-1}\}$ to produce $\{A_0 t_0 h_0, A_1 t_1 h_1, \ldots , A_{N-1} t_{N-1} h_{N-1}\}$ wherein values $\{h_0,h_1, \ldots ,h_{N-1}\}$ are weight values selected to achieve a desired filter response and $\{A_0,A_1, \ldots ,A_{N-1}\}$ are factors selected to improve computational efficiency in filtering the input data stream;

(c) means for summing the values $\{A_0 t_0 h_0, A_1 t_1 h_1, \ldots , A_{N-1} t_{N-1} h_{N-1}\}$ to produce $$\sum_{k=0}^{N-1} A_k t_k h_k;$$

and (d) means for biasing the summed values $$\sum_{k=0}^{N-1} A_k t_k h_k$$

to produce a digital filter output.

40. The apparatus of claim 39, wherein the apparatus is used to implement an approximated π/4 QPSK modulation routine.

41. A method of processing a series of input values to produce a series of output values having a desired output characteristic comprising the steps of:

computing, in a digital processor, the sum of a series of delayed, mapped, and weighted input values, wherein the weight of the delayed and mapped input values is selected to improve computational efficiency, and biasing the sum of the series of delayed, mapped, and weighted input values, in the digital processor to compensate for the selection of the weight of the mapped and delayed input values.

* * * * *

UNITED STATES PATENT AND TRADEMARK OFFICE
CERTIFICATE OF CORRECTION

PATENT NO.    : 6,308,190 B1
DATED         : October 23, 2001
INVENTOR(S)   : Alan N. Willson, Jr. and Larry S. Wasserman It is certified that error appears in the above-identified patent and that said Letters Patent is hereby corrected as shown below:

Title page,
Item [56], References Cited, U.S. PATENT DOCUMENTS, insert
-- 4,751,666   6/1988   Gillingham --
OTHER PUBLICATIONS, insert
-- Kuskie, C. et al (1995) "A Decimation Filter Architecture for GHz Delta-Sigma Modulation," IEEE Int'l Symposium on Circuits and Systems, pp. 953-956.
  Nagari, A. et al, "A 2.7V 11.8 mW Baseband ADC with 72 dB Dynamic Range for GSM", 1999, IEEE, Custom Integrated Circuits Conference, pages 133-136. --

Signed and Sealed this

Fourth Day of February, 2003

JAMES E. ROGAN
*Director of the United States Patent and Trademark Office*